(12) United States Patent
Bright et al.

(10) Patent No.: US 10,171,919 B2
(45) Date of Patent: Jan. 1, 2019

(54) THERMAL AND THERMOACOUSTIC NANODEVICES AND METHODS OF MAKING AND USING SAME

(71) Applicant: THE REGENTS OF THE UNIVERSITY OF COLORADO, A BODY CORPORATE, Denver, CO (US)

(72) Inventors: Victor M. Bright, Boulder, CO (US); Joseph J. Brown, Boulder, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 0 days.

(21) Appl. No.: 15/596,458

(22) Filed: May 16, 2017

(65) Prior Publication Data
US 2017/0332179 A1    Nov. 16, 2017

Related U.S. Application Data

(60) Provisional application No. 62/336,814, filed on May 16, 2016.

(51) Int. Cl.
| | |
|---|---|
| H04R 23/00 | (2006.01) |
| B82B 3/00 | (2006.01) |
| B82Y 40/00 | (2011.01) |
| B81C 1/00 | (2006.01) |
| H01L 51/00 | (2006.01) |
| H04R 31/00 | (2006.01) |

(52) U.S. Cl.
CPC ........ *H04R 23/002* (2013.01); *B81C 1/00158* (2013.01); *B81C 2201/0187* (2013.01); *B82B 3/0009* (2013.01); *B82B 3/0038* (2013.01); *B82B 3/0042* (2013.01); *B82Y 40/00* (2013.01); *H01L 51/0097* (2013.01); *H04R 31/00* (2013.01)

(58) Field of Classification Search
CPC ... H04R 23/002; H04R 31/00; H01L 51/0097; H01L 2924/1461; H01L 23/00; B81C 1/00158; B81C 2201/0187; B82B 3/0038; B82B 3/0042; B82B 3/0009; B82Y 40/00
USPC ......................................................... 381/164
See application file for complete search history.

(56) References Cited

U.S. PATENT DOCUMENTS

| | | | | |
|---|---|---|---|---|
| 7,820,064 | B2 * | 10/2010 | Jin | ....................... B81C 1/00031 216/41 |
| 8,044,472 | B2 * | 10/2011 | Kurtz | ..................... B82Y 10/00 257/415 |

(Continued)

OTHER PUBLICATIONS

Aliev, et al., "Alternative Nanostructures for Thermophones", ACS Nano, vol. 9, No. 5, 2015, pp. 4743-4756.

(Continued)

*Primary Examiner* — Oyesola C Ojo
(74) *Attorney, Agent, or Firm* — Saul Ewing Arnstein & Lehr LLP; Kathryn Doyle; Domingos J. Silva

(57) ABSTRACT

In one aspect, the present invention provides nano-scale heaters, such as nano-scale thermoacoustic loudspeakers comprising suspended metal nanobridges prepared using atomic layer deposition (ALD). The loudspeakers of the invention are capable of producing audible sound when stimulated with an electrical current or other energetic stimulus. In another aspect, the present invention provides methods of preparing and using such nanodevices.

22 Claims, 11 Drawing Sheets

(56) References Cited

U.S. PATENT DOCUMENTS

| | | | | |
|---|---|---|---|---|
| 8,311,245 | B2* | 11/2012 | Liu | H04R 1/028 |
| | | | | 381/164 |
| 8,615,096 | B2 | 12/2013 | Liu et al. | |
| 9,264,819 | B2* | 2/2016 | Wei | B82Y 30/00 |
| 9,619,064 | B2* | 4/2017 | Shi | H04R 23/002 |
| 2006/0281321 | A1* | 12/2006 | Conley, Jr. | B81C 1/00182 |
| | | | | 438/703 |
| 2010/0171190 | A1* | 7/2010 | Liger | G01J 5/02 |
| | | | | 257/428 |
| 2011/0073827 | A1* | 3/2011 | Rubloff | B82Y 10/00 |
| | | | | 257/3 |
| 2013/0142987 | A1* | 6/2013 | Wardle | B82B 1/00 |
| | | | | 428/98 |
| 2014/0093688 | A1* | 4/2014 | Chuo | H01L 21/0331 |
| | | | | 428/156 |
| 2016/0304341 | A1 | 10/2016 | Bright et al. | |

OTHER PUBLICATIONS

Aliev, et al., "Increasing the Efficiency of Thermoacoustic Carbon Nanotube Sound Projectors", Nanotechnology, 24, 2013, pp. 1-11.

Aliev, et al., "Thermal Management of Thermoacoustic Sound Projectors Using a Free-Standing Carbon Nanotube Aerogel Sheet as a Heat Source", Nanotechnology, 25, 2014, pp. 1-11.

Arnold, et al., "The Thermophone as a Precision Source of Sound", Second Series, vol. X, No. 1, Research Laboratory of the American Telephone and Telegraph Co. and Western Electric Company, Inc., 1917, pp. 22-38.

Asadzadeh, et al., "Thermo Acoustic Study of Carbon Nanotubes in Near and Far Field: Theory, Simulation, and Experiment", J Appl Phys, vol. 117, 2015, pp. 095101-1-095101-9.

Baker, et al., "Nucleation and Growth of Pt Atomic Layer Deposition on Al2O3 Substrates Using (ethylcyclopentadienyl)-trimethyl Platinum and O2 Plasma", J Appl Phys, vol. 109, 2011, pp. 094333-1-084333-10.

Bin, et al., "Thermoacoustic Modeling and Uncertainty Analysis of Two-Dimensional Conductive Membranes", J Appl Phys, vol. 117, 2015, pp. 064506-1-064506-10.

Bouman, et al., "Experimental Quantification of the True Efficiency of Carbon Nanotube Thin-Film Thermophones", J Acoust Soc Am, vol. 139, No. 3, 2016, pp. 1353-1363.

Brown, et al., "Molecular Layer Deposition on Carbon Nanotubes", ACS Nano, vol. 7, No. 9, 2013, pp. 7812-7823.

Brown, et al., "Ultrathin Loudspeakers from ALD", Solid-State Sensors, Actuators and Microsystems Workshop, Hilton Head Island, SC, 2016, pp. 32-35.

Carcia, et al., "Ca Test of Al2O3 Gas Diffusion Barriers Grown by Atomic Layer Deposition on Polymers", Appl Phys Lett, vol. 89, 2016, pp. 031915-1-031-15-3.

Cavanagh, et al., "Atomic Layer Deposition on Gram Quantities of Multi-Walled Carbon Nanotubes", Nanotechnology, vol. 20, 2009, pp. 1-10.

Dameron, et al., "Gas Diffusion Barriers on Polymers Using Multilayers Fabricated by Al2O3 and Rapid SiO2 Atomic Layer Deposition", J Phys Chem, vol. 112, No. 12, 2008, pp. 4573-4580.

Dutta, et al., "Gold Nanowire Thermophones", J Phys Chem C, vol. 118, 2014, pp. 29101-29107.

Eigenfeld, et al., "Electrical and Thermal Conduction in Ultra-Thin Freestanding Atomic Layer Deposited W Nanobridges", Nanoscale, vol. 7, 2015, pp. 17923-17928.

Eigenfeld, et al., "Specific Heat Capacity of Ultra-Thin Atomic Layer Deposition Nanobridges for Microbolometers", IEEE, Transducers 2015, Anchorage, Alaska, Jun. 21-25, 2015, 2015, pp. 1385-1388.

Eigenfeld, et al., "Ultra-thin 3D Nano-Devices from Atomic Layer Deposition on Polyimide", Adv Mater, vol. 26, 2014, pp. 3962-3967.

Elam, et al., "ZnO/Al2O3 Nanolaminates Fabricated by Atomic Layer Deposition: Growth and Surface Roughness Measurements", Thin Solid Films, vol. 414, 2002, pp. 43-55.

Fabreguette, et al., "Ultrahigh X-ray Reflectivity from W / Al2O3 Multilayers Fabricated Using Atomic Layer Deposition", Appl Phys Lett, vol. 88, 2016, pp. 013116-1-013116-3.

Ferguson, et al., "TiO2 Atomic Layer Deposition on ZrO2 Particles Using Alternating Exposures of TiCl4 and H2O", Appl Surf Sci, vol. 226, 2004, pp. 393-404.

George, "Atomic Layer Deposition: An Overview", Chem Rev, vol. 110, No. 1, 2010, pp. 111-131.

Groner, et al., "Gas Diffusion Barriers on Polymers Using Al2O3 Atomic Layer Deposition", Appl Phys Lett, vol. 88, 2006, pp. 051907-1-051907-3.

Herrmann, et al., "Multilayer and Functional Coatings on Carbon Nanotubes Using Atomic Layer Deposition", Appl Phys Lett, vol. 87, 2005, pp. 123110-1-123110-3.

Hu, et al., "Solution for Acoustic Field of Thermo-Acoustic Emission from Arbitrary Source", AIP Advances, vol. 4, 2014, pp. 107114-1-107114-7.

Hu, et al., "Wideband Flat Frequency Response of Thermo-Acoustic Emission", J Phys D: Appl Phys, vol. 45, 2012, pp. 345401-345408.

Kim, et al., "Atomic Layer Deposition of Ruthenium and Ruthenium-oxide Thin Films by Using a Ru(EtCp)2 Precursor and Oxygen Gas", J Korean Phys Soc, vol. 55, No. 1, 2009, pp. 32-37.

Klaus, et al., "Atomic Layer Deposition of SiO2 at Room Temperature Using NH3-catalyzed Sequential Surface Reactions", Surface Sci, vol. 447, 2000, pp. 81-90.

Kozlov, et al., "Sound of Carbon Nanotube Assemblies", J Appl Phys, vol. 106, 2009, pp. 124311-1-124311-8.

Liang, et al., "Nanocoating Hybrid Polymer Films on Large Quantities of Cohesive Nanoparticles by Molecular Layer Deposition", AIChE Journal, vol. 55, No. 4, 2009, pp. 1030-1039.

Mason, et al., "Thermoacoustic Transduction in Individual Suspended Carbon Nanotubes", ACS Nano, vol. 9, No. 5, 2015, pp. 5372-5376.

McDonald, et al., "Generalized Theory of the Photoacoustic Effect", J Appl Phys, vol. 49, No. 4, 1978, pp. 2313-2322.

Niskanen, et al., "Suspended Metal Wire Array as a Thermoacoustic Sound Source", Appl Phys Lett, vol. 95, 2009, pp. 163102-1-163102-3.

Shinoda, et al., "Thermally Induced Ultrasonic Emission from Porous Silicon", Nature, vol. 400, 1999, pp. 853-855.

Suk, et al., "Thermoacoustic Sound Generation from Monolayer Graphene for Transparent and Flexible Sound Sources", Adv Mater, vol. 24, 2012, pp. 6342-6347.

Suzuki, et al., "Study of Carbon-Nanotube Web Thermoacoustic Loud Speakers", Japanese J Appl Phys, vol. 50, 2011, pp. 01BJ10-1-01BJ10-4.

Tian, et al., "A Reduced Graphene Oxide Sound-emitting Device: A New Use for Joule Heating", RSC Advances, vol. 3, 2013, pp. 17672-17676.

Tian, et al., "Flexible, Ultrathin, and Transparent Sound-emitting Devices Using Silver Nanowires Film", Appl Phys Lett, vol. 99, 2011, pp. 253507-1-253507-4.

Tian, et al., "Graphene Earphones: Entertainment for Both Humans and Animals", ACS Nano, vol. 8, No. 6, 2014, pp. 5883-5890.

Tian, et al., "Graphene-on-Paper Sound Source Devices", ACS Nano, vol. 5, No. 6, 2011, pp. 4878-4885.

Tian, et al., "Single-layer Graphene Sound-emitting Devices: Experiments and Modeling", Nanoscale, vol. 4, 2012, pp. 2272-2277.

Vesterinen, et al., "Fundamental Efficiency of Nanothermophones: Modeling and Experiments", Nano Lett, vol. 10, 2010, pp. 5020-5024.

Wei, et al., "Thermoacoustic Chips with Carbon Nanotube Thin Yarn Arrays", Nano Lett, vol. 13, 2013, pp. 4795-4801.

Wilson, et al., "Nucleation and Growth During Al2O3 Atomic Layer Deposition on Polymers", Chem Mater, vol. 17, 2005, pp. 5625-5634.

Wilson, et al., "Tungsten Atomic Layer Deposition on Polymers", Thin Solid Films, vol. 516, 2008, pp. 6175-6185.

(56) References Cited

OTHER PUBLICATIONS

Wind, et al., "Nucleation Period, Surface Roughness, and Oscillations in Mass Gain Per Cycle During W Atomic Layer Deposition on Al2O3", J Appl Phys, vol. 105, 2009, pp. 074309-1-074309-13.
Xiao, et al., "Flexible, Stretchable, Transparent Carbon Nanotube Thin Film Loudspeakers", Nano Lett, vol. 8, No. 12, 2008, pp. 4539-4545.

* cited by examiner

· · · · · Eq. 1
———— Wave Emission Only
— — — Wave Emission and Beam Loss
———— Ref. 11
— — — Wave, Beam, and Substrate

THERMAL AND THERMOACOUSTIC NANODEVICES AND METHODS OF MAKING AND USING SAME

CROSS-REFERENCE TO RELATED APPLICATIONS

The present application claims priority under 35 U.S.C. § 119(e) to U.S. Provisional Patent Application 62/336,814, filed May 16, 2016, which is incorporated herein by reference in its entirety.

BACKGROUND OF THE INVENTION

The development of nanoscale manufacturing and nanomaterials engineering has led to a recent surge of interest in thermoacoustic sound production. Such method of sound production have emerged in the field of nanotechnology as one of the most accessible techniques for active nanoscale signal transduction. Thermoacoustic transduction provides a mechanism for sound generation that is done without mechanical vibration and that operates at size scales as small as a single nanotube. Thermoacoustic loudspeakers, also known as thermophones, have been demonstrated using materials such as porous silicon (Si), carbon nanotube thin films (CNTs), nanowire arrays, and graphene. Unfortunately, to date reported thermoacoustic devices present challenges in manufacturing due to the use of specialized materials with high fabrication temperatures, such as carbon nanotubes or graphene, which typically require synthesis at temperatures above 600° C.

There is thus a need in the art for novel thermal and/or thermoacoustic nanodevices and methods of fabricating and using the same. Such nanodevices should be easily fabricated, using technology that allows for low temperature synthesis protocols and atomic precision control. The present invention meets this need.

BRIEF SUMMARY OF THE INVENTION

The invention provides a nanodevice comprising a solid substrate; a first solid supporting material block and a second solid supporting material block; and at least one ultrathin film block comprising a first face and an opposite second face.

In certain embodiments, the first and second supporting material blocks are in physical contact with the same surface of the solid substrate. In other embodiments, the section of the solid substrate defined inbetween the first and second supporting material blocks does not comprise an additional supporting material block.

In certain embodiments, the first face comprises a solid material nucleation layer. In other embodiments, the opposite second face comprises an electrically conducting layer. In yet other embodiments, a section of the first face of each ultrathin film block is in physical contact with the first supporting material block. In yet other embodiments, a distinct section of the first face of each ultrathin film block is in physical contact with the second supporting material block, such that each ultrathin film block spans the width of the section of the solid substrate defined inbetween the first and second supporting material blocks. In yet other embodiments, the at least one ultrathin film block does not have physical contact with the solid substrate, such that the at least one ultrathin film block is suspended over the solid substrate.

In certain embodiments, the at least one ultrathin film block has an average thickness that is equal to or lower than about 50 nm.

In certain embodiments, the nanodevice further comprises a first conductive block and a second conductive block. In other embodiments, the first conductive block has physical and electrical contact with a section of the second face of the at least one ultrathin film blocks which is approximately opposite to the section of the corresponding first face that is in physical contact with the first supporting material block. In yet other embodiments, the second conductive block has physical and electrical contact with a section of the second face of the at least one ultrathin film block which is approximately opposite to the section of the corresponding first face that is in physical contact with the second supporting material block.

In certain embodiments, the at least one ultrathin film block has an average thickness that is equal to or lower than a value selected from the group consisting of about 30 nm, about 10 nm, about 5 nm, and about 1 nm.

In certain embodiments, the solid substrate comprises at least one selected from the group consisting of silica, alumina, glass, metal, silicon, semiconductor, electrical insulator, vitreous carbon, plastic, polymer, elastomer, fabric, paper, and nanofibrous article.

In certain embodiments, the solid supporting material layer is deposited using at least one selected from the method consisting of molecular layer deposition (MLD), atomic layer deposition (ALD), spin-coating, spray coating, contact adhesion, casting, evaporation, and sputtering. Alternatively, the solid supporting material layer is prepared by patterning a polymer and creating a 3D anchor using ALD.

In certain embodiments, the solid supporting material layer comprises at least one selected from the group consisting of a polyimide, polydimethylsiloxane, polystyrene, epoxy, polypropylene, poly(methyl (meth)acrylate), polyethylene, poly(vinyl chloride), polycaprolactone, polyethylene terephthalate, polyvinyl alcohol, polysaccharide, chitin, polypeptide, and polylysine.

In certain embodiments, the section of the solid substrate defined inbetween the first and second supporting material blocks is essentially free from the supporting material, or has a coating of supporting material which has lower thickness than the thickness of the first or second supporting material blocks.

In certain embodiments, first and second supporting material blocks have approximately the same thickness. In other embodiments, the first and second supporting material blocks are approximately parallel to each other. In yet other embodiments, the at least one ultrathin film block is prepared using a manufacturing method comprising atomic layer deposition (ALD). In yet other embodiments, the manufacturing method further comprises atomic layer etching (ALE). In yet other embodiments, the nucleation layer and the electrically conducting layer are prepared using a method comprising ALD.

In certain embodiments, the at least one ultrathin film block comprises at least one selected from the group consisting of a metal, metal oxide, semimetal, semiconductor, alkoxide polymer, polyamide, and metal nitride.

In certain embodiments, the nucleation layer comprises at least one selected from the group consisting of $Al_2O_3$, $GeO_2$, $HfO_2$, indium tin oxide, $RuO_2$, SiC, SiGe, $SiO_2$, $Si_3N_4$, AlN, BN, GaN, diamond, $SnO_2$, $TaN_x$, $TaO_x$, TiC, TiN, $TiO_2$, $V_2O_5$, $VO_x$, ZnO, ZnS, and $ZrO_2$.

In certain embodiments, the electrically conducting layer comprises at least one selected from the group consisting of Ag, Al, Au, Co, Cu, Fe, Ge, Ir, Mo, Ni, Os, Pd, Pt, Rh, Ru, Si, Ta, Ti, and W.

In certain embodiments, the first and second conductive blocks are independently selected from the group consisting of Al, Ti, Cu, Ni, Ta, Cr, Ag, Mo, and Au.

In certain embodiments, the nanodevice is at least partially immersed in a fluid.

In certain embodiments, a stimulus is applied to the first and conductive blocks, the at least one ultrathin film block undergoes temperature changes, wherein the stimulus comprises at least one selected from the group consisting of electrical current, electromagnetic radiation, energetic particle, and subatomic particle.

In certain embodiments, the temperature changes of the at least one ultrathin film block form pressure waves or thermal waves in the surrounding fluid.

In certain embodiments, the nanodevice is a thermoacoustic nanodevice. In other embodiments, the nanodevice is a thermal nanodevice.

The invention further provides a method of preparing the nanodevice of the invention. In certain embodiments, the method comprises depositing a layer of solid supporting material on at least a section of the solid substrate. In other embodiments, the method comprises depositing a nucleation layer on at least a section of the surface of the solid supporting material using ALD. In yet other embodiments, the method comprises depositing an electrically conducting layer on the deposited nucleation layer using ALD. In yet other embodiments, an additional nucleation layer is deposited using ALD in order to protect the electrically conducting layer from overetching. In yet other embodiments, the method comprises patterning the width and length of the at least one ultrathin film block on the surface of the ALD-deposited nucleation and electrically conducting layers using etching. In yet other embodiments, the additional nucleation layer is removed using an etching process such as a selective wet etch. This step exposes the ALD electrically conducting layer before deposition of the electrical blocks in order to achieve good electrical contact between the ALD conductor and the deposited additional blocks. In yet other embodiments, the method comprises removing the exposed solid supporting material through etching, so as to allow the resulting at least one ultrathin film block to be suspended over the solid substrate.

Alternatively, the initially deposited supporting material layer can be patterned to allow the ALD layers to form a 3D shell that serves as a supporting block. This procedure avoids reliance on unetched polymer and/or other material in the solid supporting material layer.

In certain embodiments, the method further comprises depositing and patterning the first and second conductive blocks, such that the first conductive block physically and electrically contacts one exposed length-wise extremity of the surface of the at least one patterned ALD-deposited layer, and the second conductive block physically and electrically contacts the opposing exposed length-wise extremity of the surface of the at least one patterned ALD-deposited layer. In other embodiments, the step of depositing and patterning the first and second conductive blocks takes place after the step of patterning the width and length of the at least one ultrathin film block on the surface of the ALD-deposited nucleation and electrically conducting layers. In yet other embodiments, the step of depositing and patterning the first and second conductive blocks takes place before the step of removing the exposed solid supporting material through etching.

In certain embodiments, the step of patterning the width and length of the plurality of ultrathin film blocks on the surface of the ALD-deposited nucleation and electrically conducting layers comprises $O_2/CF_4$ reactive ion etching. In other embodiments, the step of removing the exposed solid supporting material comprises isotropic $O_2$ plasma etching.

The invention further provides a method of generating at least one wave selected from the group consisting of thermal, pressure, and sound, using the nanodevice of the present invention.

In certain embodiments, the method comprises applying a stimulus to the at least one ultrathin film block of the nanodevice of the present invention, wherein the nanodevice is at least partially immersed in a fluid, whereby the at least one ultrathin film block undergoes temperature changes, which promotes formation in the surrounding fluid of at least one selected from the group consisting of thermal wave, pressure wave, and sound wave. In certain embodiments, the stimulus is at least one selected from the group consisting of electrical current, electromagnetic radiation, energetic particle, and subatomic particle.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

FIG. 2A: Far field (spherical wave) efficiency and sound power, modeled at 1 cm distance. FIG. 2B: Near field (plane wave) efficiency and sound power. The legend at the bottom applies to FIGS. 2A-2B.

FIG. 11A [0° 0° 0°], FIG. 11B [−90° 0° 90°], FIG. 11C [−180° 0° 180° ], FIG. 11D [−270° 0° 270°].

FIG. 15A: Close up view. FIG. 15B: View showing top and bottom foam surfaces of the interior of the anechoic chamber.

DETAILED DESCRIPTION OF THE INVENTION

Figure 1:
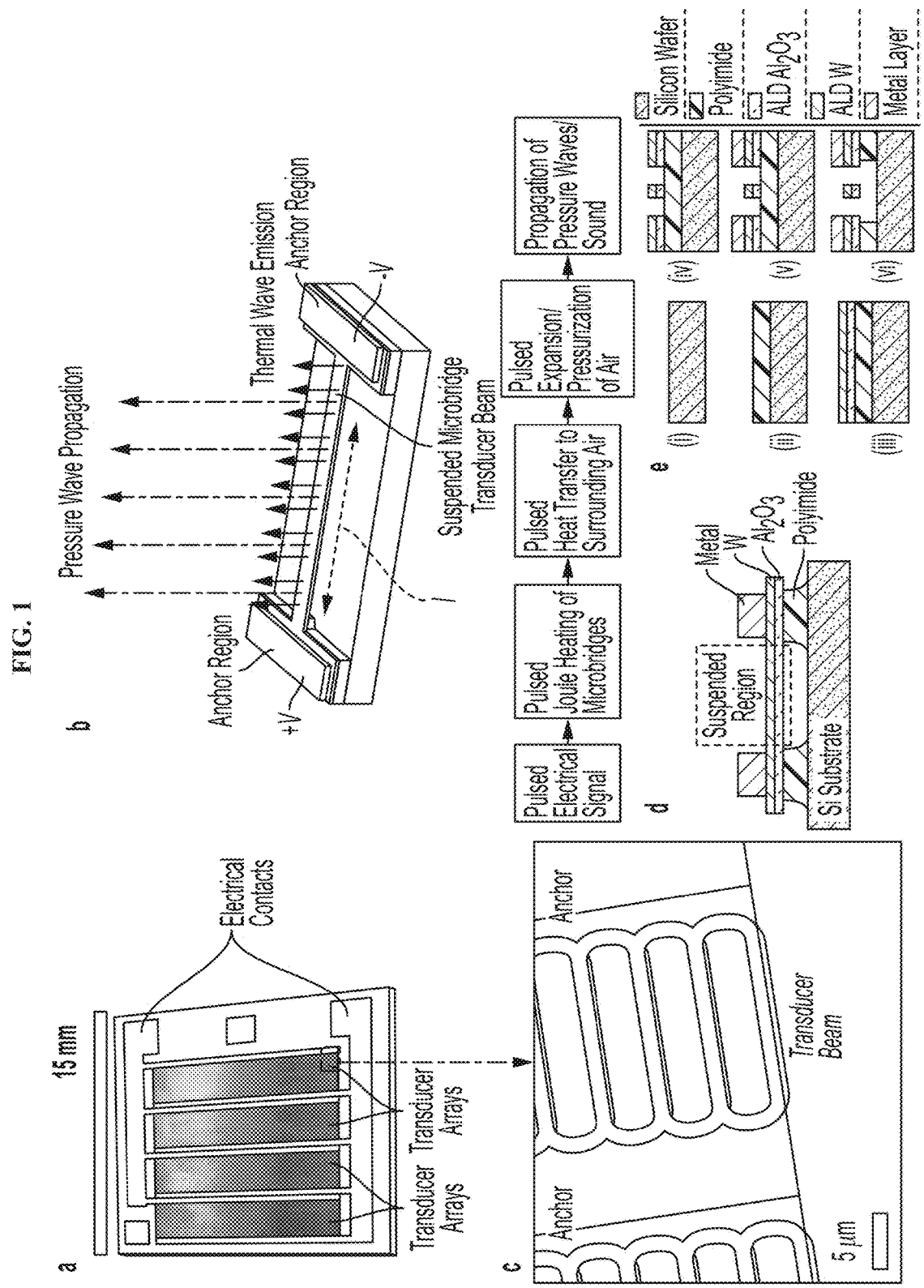
FIG. 1 illustrates a non-limiting fabricated nanodevice and transduction concept. Panel a: Optical camera image of a fabricated transducer chip. Panel b: Non-limiting principle of thermoacoustic transduction from a suspended nanobridge, showing idealized nanoscale thermal and pressure wave propagation. Panel c: SEM image of suspended nanobridge transducer beams used for thermoacoustic sound generation. In this image, beams are 17 μm long, 1 μm wide, and 25.8 nm thick. Further, the beams are suspended 3.5 μm above the substrate. Anchor regions provide mechanical connection to the substrate. Panel d: Cross-section diagram of the fabricated nanodevices. Panel e: Fabrication process is illustrated by the following steps. (i) Provide a silicon wafer substrate; (ii) Spin-coat a polyimide sacrificial layer; (iii) Perform ALD of alumina (6.5 nm) and tungsten (19.3 nm) at 130° C.; (iv) Pattern the ALD layers using $O_2/CF_4$ RIE to form the bridge structures; (v) Deposit and pattern metal layer, 500 nm of aluminum or 20 nm Ti/500 nm Au; (vi) Release the transducer nanobridge structures using an isotropic $O_2$ plasma etch.

In one aspect, the present invention provides nano-scale thermoacoustic loudspeakers comprising one or more suspended metal nanobridges prepared using atomic layer deposition (ALD). The loudspeakers of the invention are capable of producing audible sound when stimulate with a current or any other energetic stimulus. In another aspect, the present invention provides methods of preparing and using such nanodevices.

The recent development of low-temperature (<200° C.) ALD for fabrication of freestanding nanostructures enables consideration of active device design based on engineered ultrathin films (defined herein as being ≤50 nm in thickness). As demonstrated herein, arrays of suspended nanobridges with 25.8 nm thickness and sizes as small as 17 μm×2 μm were fabricated and demonstrated to produce audible sound using the thermoacoustic effect. The nanobridges were fabricated by ALD of 6.5 nm $Al_2O_3$ and 19.3 nm tungsten on sacrificial polyimide, with ALD performed at 130° C. and patterned by standard photolithography. The maximum observed loudspeaker sound pressure level (SPL) was 104 dB, measured at 20 kHz, 9.71 W input power, and 1 cm measurement distance, providing a loudspeaker sensitivity value of ~64.6 dB SPL/1 mW. Sound production efficiency was measured to vary approximately proportionally to frequency $f^3$ and was directly proportional to input power. The nanodevices of the invention demonstrate industrially feasible nanofabrication of thermoacoustic transducers and a sound production mechanism pertinent to submicron-scale device engineering. It should be appreciated that the thermoacoustic effect generates sound from pulsed heating of a fluid. Thus, demonstration of thermoacoustic sound production implies that the nanobridges were demonstrated to operate as heaters. A heater can be understood to be an object that undergoes a change in temperature, and then transfers thermal energy to the region surrounding this object. In the case of the nanobridges, temperature changes of the nanobridges heat (transfer thermal energy to) the media that may be surrounding the nanobridges.

Disclosure

In certain aspects, this invention relates to generation of sound and ultrasound by a thermoacoustic process from material films generated by atomic layer deposition (ALD) and/or molecular layer deposition (MLD), and applications thereof, and preparation of such nanodevices. In another aspects, the present invention provides an approach to lumped-element modeling for design of thermoacoustic nanodevices, and relates the near-field plane wave model of individual transducer beams to the far-field spherical wave sound pressure that can be measured with standard experimental techniques.

In sound generation using the thermoacoustic effect, heated structures induce pressure changes in surrounding fluid (gas or liquid). At microscale distances, heat transfer time scales can be on the order of microseconds, and pulsed heating can be used to generate sound waves.

Many recent innovations in thermoacoustic sound generation rely on the use of carbon nanotubes as thermoacoustic transducers. These materials present difficulties in processing, and such difficulties can be avoided with a more reliable thin film production process. By use of atomic layer deposition, the present invention is inherently integrable with conventional microfabrication processes and can be readily processed in standard microdevice production lines. Furthermore, ALD provides materials of standardized, repeatable thicknesses that contribute to predictable results in manufacturing. Use of ALD presents an advantage over competing thermoacoustic microscale sound generators in that it is entirely CMOS integrable, and can even be performed on flexible substrates.

ALD deposits materials conformally with atomic precision based on the automated cycling of component gases. The growth of individual layers is a self-limiting reaction, resulting in linear growth of material, dependent upon the number of cycles to which a substrate is exposed. ALD materials currently available include ceramics ($Al_2O_3$, TaN, $SiO_2$, $HfO_2$, MgO, MnO), metals (W, Pt, Ru), semiconductors (ZnO, AlN), and various other inorganic materials. Molecular layer deposition (MLD) uses a similar approach to generate controlled-thickness conformal polymer layers, typically alkoxide or polyamide compositions. MLD layers are formed from a wide variety of reactive organic groups and can be deposited in combination with inorganic ALD layers. Both ALD and MLD allow thickness control and conformality unmatched by any other available industrial process, and this control remains when ALD is performed in large-scale industrial processing. Moreover, the ALD and MLD processes are performed at low temperatures, with typical deposition temperatures <200° C.

The present invention addresses, in one aspect, the use of thermoacoustic transduction to produce sound from ultrathin tungsten films fabricated by ALD and surface micromachining (FIG. 1). By using ultrathin films formed by ALD and a sacrificial polymer layer released by dry etching, the present disclosure demonstrates functional thermoacoustic loudspeakers from a nanomanufacturing process that is readily integrated to industrial processes such as CMOS and roll-to-roll fabrication, and yet allows thickness control with atomic precision, generation of films as thin as about 2 nm, and design of individual nanobridges operating on the same physics as larger-scale device arrays.

At the macroscale, sound production most commonly uses magnetic systems such as voice coils, which are difficult to scale to small sizes, as they present material integration challenges of magnetic materials, and introduce electromechanical resonances due to inductive transduction. Other alternatives, such as electrostatic speakers or piezoelectrics, require high voltages for transduction, and the associated strong electric fields risk material and local environment damage when miniaturized to nanoscale structures.

In contrast to these approaches, thermoacoustic transduction generates sound from pulsed heating of solid structures and is based purely on resistive effects, without any moving parts and without the resonant effects that may occur with inductive (voice coil) or capacitive (piezoelectric) transduction. A major driver for integration of thermoacoustic transducers to micro- and nanosystems is that they allow signal transduction at low voltages, thereby preventing electrical breakdown and associated damage to materials.

In the transduction mechanism of the electrically stimulated thermoacoustic effect (FIG. 1, Panel b), Joule heating from an oscillating electrical current creates temperature pulses in a solid material, and heat conduction generates coupled temperature and pressure fluctuations in a surrounding fluid. The pressure fluctuations propagate away from the device as sound waves. The heating can be generated from other energetic stimuli of the solid material, such as absorption of electromagnetic radiation or bombardment by energetic particles, including subatomic particles such as electrons.

Very good sound production has been measured from thermoacoustic devices, with 85-110 dB sound pressure level (SPL) measured in air, and up to 200 dB SPL measured for encapsulated devices in water. SPL is defined relative to $2 \times 10^{-5}$ Pa reference pressure. The transduction efficiency $\eta$ (sound power out/electrical power in) is typically $\sim 10^{-6}$ to $10^{-5}$ for audio frequencies. With protective encapsulation of thermoacoustic carbon nanotube sheets, $\eta$ as large as 0.001 to 0.02 has been reported, with $\eta$ up to $10^{-4}$ for unencapsulated sheets. It is unclear whether some of these prior results overestimate the efficiency due to measurement with a sound level meter, which integrates root-mean-square (rms) pressure across the frequency spectrum, rather than measurement of a targeted frequency as in other work in the field.

In auditory frequencies, thermoacoustic loudspeakers typically have a frequency-dependent behavior of sound pressure and efficiency, increasing proportional to the square of the frequency f (Eq. 1) until saturating at some maximum level independent of f (Eq. 2). Here, $\rho_g$ is the density of air, $\sim 1.0$ kg/$m^3$ for $\sim 1700$ m elevation at the site of experiments in Boulder, Colo., USA; $v_g$ is the isothermal speed of sound in air, $\sim 334$ m/s; $c_p$ is the specific heat of air, $\sim 1005$ J/(kg K); $T_0$ is ambient temperature; $\sim 293$ K; and $A_0$ is the sound emitting area of a transducer. $Q_0$ is the total input power to a device.

From Eqs. 1 and 2, the linear dependence of $\eta$ on input power $Q_0$ is obvious. Both of these equations can be derived analytically from solution of the thermoacoustic governing equations under assumption of spherical (Eq. 1) or plane wave (Eq. 2) sound emission. The Carnot limit presents the upper bound on Eqs. 1-2.

$$\eta = \frac{\pi f^2}{\rho_g v_g c_p^2 T_0^2} Q_0 \qquad (1)$$

$$\eta = \frac{v_g}{2\rho_g c_p^2 T_0^2} \left( \frac{Q_0}{A_0} \right) \qquad (2)$$

The efficiency $\eta$ may be related directly to the root-mean-square (rms) pressure of a sound wave through the definition of sound intensity I[W/$m^2$] according to Eqs. 3-4, and selection of a pertinent area $A_0$. For device measurements at distance $r_0$, $A_0 = 2\pi r_0^2$, assuming half-space spherical wave propagation from a device. For consideration of output from an individual beam within an array, a smaller $A_0$ is selected, such as $A_0 = L_B d_n$, where $L_B$ is the beam length, and $d_n$ is the width of an array allocated per beam (i.e., beam width plus beam spacing). Calculated rms pressure values can also be used as inputs to Eq. 4 in order to model behavior of thermoacoustic transducers SPL relates to these values according to Eq. 5, where the reference pressure $p_0=2\times10^{-5}$ Pa.

$$I = \frac{p_{rms}^2}{\rho_g v_g} \quad (3)$$

$$\eta = \left(\frac{p_{rms}^2}{\rho_g v_g}\right)\left(\frac{A_0}{Q_0}\right) \quad (4)$$

$$SPL = 10\log_{10}\left(\frac{p_{rms}}{p_0}\right)^2 \quad (5)$$

Under certain conditions, namely plane wave production and $\omega \gg \alpha_s/2L_s^2$ (as derived in Hu, et al., 2012, J. Phys. D. Appl. Phys. 45:345-401 for heat conduction to a solid substrate in a one-dimensional model), the frequency dependence of $\eta$ may be mitigated, resulting in a flat frequency response. Here, $\omega=2\pi f$, $\alpha_s$ is the thermal diffusivity of the thermoacoustic transducer, and $L_s$ is a characteristic one-dimensional (1D) thermal conduction length. For a thermoacoustic thin film supported on a solid substrate, $L_s$ is the film thickness. For suspended nanobridges, 1D heat conduction to the solid substrate occurs through the ends of the nanobridges with a maximum temperature at the center, implying that heat flow in the direction of the beam is also 0 at the center, and the maximum distance of heat flow is $L_B/2$. In this case, $L_s$ may be considered as half the beam length, i.e., $L_s=L_B/2$. In encapsulated systems, other behavior may emerge such as $f^{-3/2}$ dependence and mechanical resonance from transmission of sound through packaging layers.

There are several potential strategies to maximize sound production from nanomaterials.

First, substrate losses should be minimized by suspending devices as far from fabrication substrates as possible.

Second, the areal heat capacity of the transducer should be minimized, such as by using the thinnest films possible. Although made mostly from a material, tungsten, with a high specific heat, the devices reported below have a real heat capacity of 0.18 J/(m$^2$ K) because of the nanoscale thickness of the actuating layer. Another mechanism proposed to reduce areal heat capacity on an average level is to increase the sparseness of transducers across an area, but the system dynamics would remain governed by the physical shape of the individual transducers.

A third strategy is to maximize or concentrate heat flux $q_0$ [J/m$^2$] from the transducer. Thermoacoustic transducers typically show improved efficiency as heat flux is increased. Another tactic is to maximize the heat transfer to the surrounding fluid, such as by maximizing the transducer surface area, and distributing power evenly through a sample. Typical models for thermoacoustic loudspeakers assume no thermal resistance between a surface and its contacting fluid, but practical reports indicate the need for better consideration.

One last approach is to process electrical input signals to minimize DC power losses while maximizing AC power fluctuation. Joule heating creates frequency doubling in thermoacoustic transducers, the mitigation of which requires strategies such as DC biasing or amplitude modulation of a carrier frequency. For example, when music is played through the devices, significant distortion from frequency doubling results if no DC bias is added to the signal. With a DC bias applied, audible sound is easily recognizable as music with good fidelity.

Devices using ultrathin (≤50 nm by definition) films produced by ALD allow engineering according to the transduction principles identified above.

Thermoacoustic Analysis.

The fundamental physical problem for thermoacoustic transduction is expressed in the coupled temperature and pressure field equations, Eqs. 6-7, which apply for small velocities with isentropic behavior (no shock waves).

$$\nabla^2 T - \frac{1}{\alpha}\frac{\partial T}{\partial t} = -\frac{S}{\kappa} - \frac{1}{\kappa}\frac{\partial p}{\partial t} \quad (6)$$

$$\nabla^2 p - \frac{1}{v_g^2}\frac{\partial^2 p}{\partial t^2} = -\frac{\rho_g}{T_0}\frac{\partial^2 T}{\partial t^2} \quad (7)$$

Here, T is temperature, $T_0$ is ambient temperature, t is time, p is pressure, S is heat flux source, $\kappa$ is thermal conductivity of air (0.026 W m$^{-1}$K$^{-1}$), and $\alpha$ is thermal diffusivity of air (2.3×10$^{-5}$ m$^2$/s). Most models take a distributed approach to solution of Eqs. 6-7, and ignore some of the relevant conduction effects in the transducer materials such as in-plane conduction within a flat transducer layer.

Following some simplifications, thermoacoustic sound generation in the audible range can be interpreted as a source driving a temperature wave, which drives a propagating pressure wave. The thermal wave decays rapidly, with diffusion length $\mu_t=(\pi/\pi f)^{1/2}$ ($\mu_t(100$ Hz$)=270$ μm; $\mu_t(100$ kHz$)=8.6$ μm). Therefore, in macroscale distances, the thermal wave is not significant, but in detailed modeling it is a consideration in the vicinity of the transducers, such as in the gas between the suspended beams and the substrate.

Solutions to the thermoacoustic equations have been explored in depth in literature, and allow calculation of acoustic wave fields emanating from thermoacoustic structures. In particular, Hu, et al., 2014. AIP Adv. 4:107-114 found the generalized case of the pressure wave $\psi_i$ at a specified point $\vec{r}$ resulting from sound emission from a specified surface $\Omega$. Assuming perfect heat conduction from a thermoacoustic emitter to surrounding gas, $\psi_i$ is given by Eq. 8, which is a simplification of Eq. 11 from Hu, et al., 2014. AIP Adv. 4 107-114:

$$\psi_i = \left(\frac{j\omega q_0}{2\pi c_p T_0}\right)\int\int_\Omega \frac{1}{r}\exp\left(-\frac{j\omega r}{v_g}\right)d\Omega \quad (8)$$

In a device comprised of L arrays, formed from M rows of N beams, the total pressure wave $\Psi$ observed at a given point is the sum of the emitted waves from each of the individual beams, Eq. 9. As this result is based on the assumption of harmonic input, the effect of phase delay is obtained simply by multiplying $\Psi$ by $e^{-j\phi}$ where $\phi$ is the phase variance. The rms sound pressure $p_{rms}$ is calculated from $\Psi$, Eq. 10. Eqs. 1 and 2 may be derived from Eq. 10, depending on assumptions of emitter area, substrate, and wave shape (i.e., spherical vs. planar). These calculations suggest that directive sound is attainable using a phased array of thermoacoustic devices, enabling possible applications in non-destructive testing and medical ultrasonics.

$$\Psi(\vec{r}) = \sum_{l=1}^{L}\sum_{m=1}^{M}\sum_{n=1}^{N} \psi_{lmn} \quad (9)$$

$$P_{rms} = \left(\frac{\Psi\Psi^*}{2}\right)^{\frac{1}{2}} \quad (10)$$

Lumped Element Model for Thermoacoustic Nanobridges.

In certain embodiments, the aprior art model for suspended thermoacoustic bridges of finite length assumes infinite-length beams. This assumption allows assessment of the upper bounds of sound production efficiency (Eqs. 1-2), but it ignores effects of thermal conduction within finite beams on the output frequency spectrum. The thermal diffusivity calculated for ALD W beam material is $\alpha_s = 2.25 \times 10^{-6}$ m$^2$/s. Using this value, in combination with the range of beam lengths that are practical for microfabrication of suspended nanobridges, the criterion identified by Hu, et al., 2012, J. Phys. D. Appl. Phys. 45:345-401 for flat frequency response, $\omega \gg \alpha_s/2L_s^2$ or $f \gg \alpha_s/4\pi L_s^2$, provides an assessment of the importance of beam length. This criterion may be satisfied in the audible frequency range for long beams; for example, it requires $f \gg 2$ Hz for 600 μm beams. This may not be possible for designs using shorter beams. For 17 μm beams, $f \gg 2.5$ kHz is required. This suggests that models of thermoacoustic emission from nanoscale beams should account for heat flux through the beams in addition to emitted power. This is accomplished elsewhere herein by means of a lumped element approach in a new model for heat flow from thermoacoustic transducers. This model is distinct from previous models in that it accounts for heat conduction and heat capacity in nanobridges of finite length.

In each transducer beam, energy production from Joule heating is balanced (Eq. 11) by emission of a thermal wave from the top surface of the beam (Eq. 12), heat conduction and storage in the beam (Eq. 13), and emission of a thermal wave and conduction through the air to the underlying substrate (Eq. 14) from the bottom surface of the beam. Here, each $\dot{Q}$ term is a lumped heat power flow and harmonic analysis is used to find solutions to these equations. Heat flow from the top surface is given by the 1D thermal wave output, Eq. 12, wherein κ is thermal conductivity of air, 0.026 W/(m K), $T_{AC}$ is the amplitude of the oscillating component of the beam temperature, $L_B$ is the beam length, $w_B$ is the beam width, and $k_1$ is the thermal wavenumber, given by $k_1 = (j\omega/\alpha)^{1/2}$. Heat loss in the beam is described by Eq. 13, where the thermal resistance $R_{beam} = (L_B/2)/(\kappa_f \delta w_B)$ and thermal capacitance $C_{beam} = \rho_f c_f \delta w_B L_B$. Film thickness is δ, film density is $\rho_f$, specific heat of the film is $c_f$, and thermal conductivity of the film is $\kappa_f$. There is a hot spot at the center of each beam, and heat flows in each half to the anchored regions at the ends. In order to explore the spectral response of the model, input power supplied to the transducer beam is modeled as $P = (P_{AC})e^{-j\omega t}$, and it can be shown that average AC input power $\dot{Q}_{in} = Q_0 = P_{AC}$, which is the amplitude of AC power fluctuations. AC Joule heating power can have several frequency components at higher harmonics due to I$^2$R frequency doubling of the electrical signal, and temperature dependence of electrical resistance. The power flowing from the bottom of the beam, Eq. 14, is a combination of a thermal wave and heat conduction to the substrate, with $R_{gap} = g/(\kappa d_n L_B)$ and $C_{gap} = \rho_g c_p g d_n L_B$, where g is the distance by which the transducer is suspended above the substrate. Although it is included here for completeness, heat capacity of the air in the gap has a negligible effect on this model for gap sizes on the order of microns.

$$\dot{Q}_{in} = \dot{Q}_{top} + \dot{Q}_{bottom} + \dot{Q}_{beam} \quad (11)$$

$$\dot{Q}_{top} = -j\kappa k_1 T_{AC} L_B w_B \quad (12)$$

$$\dot{Q}_{beam} = T_{AC} R_{beam}^{-1} - j\omega C_{beam} T_{AC} \quad (13)$$

$$\dot{Q}_{bottom} = -j\kappa k_1 T_{AC} L_B w_B + T_{AC} R_{gap}^{-1} - j\omega C_{gap} T_{AC} \quad (14)$$

Substituting Eqs. 12-14 into the energy balance equation, Eq. 11, the system model Eq. 15 may be obtained. If $P_{AC}$ is given, this allows calculation of $T_{AC}$, near field "piston velocity" u, rms sound pressure $p_{rms}$, Eqs. 16-18, and sound transduction efficiency η from Eq. 4.

Calculation of u derives from the continuity and ideal gas equations, and in this model assumes the sound pressure generated from the beam diminishes as the sound wave spreads over the distance $d_n$ allocated to each beam in an array. Eq. 17 provides the 1D pressure fluctuation velocity, from two waves of nearly-identical phase originating from the top and bottom of the beam, and spreading out to the allocated width $d_n$. Plane wave 1D analysis is appropriate at the individual transducer beam scale because the operation of these beams in parallel arrays creates a symmetry condition that confines the beams in 1D.

$$P_{AC} = -2j\kappa k_1 T_{AC} L_B w_B + T_{AC} R_{beam}^{-1} - j\omega C_{beam} T_{AC} + T_{AC} R_{gap}^{-1} - j\omega C_{gap} T_{AC} \quad (15)$$

$$T_{AC} = P_{AC}[-2j\kappa k_1 L_B w_B + R_{beam}^{-1} - j\omega C_{beam} + R_{gap}^{-1} - j\omega C_{gap}]^{-1} \quad (16)$$

$$u = 2\left(\frac{\omega}{k_1}\right)\left(\frac{T_{AC}}{T_0}\right)\left(\frac{w_B}{d_n}\right) \quad (17)$$

$$p_{rms} = \rho_g v_g \frac{|u|}{\sqrt{2}} \quad (18)$$

The beams themselves have a heating transient frequency response. Ignoring heat flux through the top and bottom of the beam, the heating transient natural frequency is calculated as $\omega = (R_{beam} C_{beam})^{-1}$, with thermal time constant $\tau = R_{beam} C_{beam}$. This implies that the beam should be able to generate temperature fluctuations up to $f = (2\pi R_{beam} C_{beam})^{-1}$ without accumulating a steady-state temperature change. Above this limit, a thermal wave model may be more appropriate as the thermal diffusion length $\mu_t$ shrinks to the same order of magnitude as the beam length $L_B$. In reality, the heat transfer to the gas on both the top and bottom sides of the beam pushes this limit higher. This analysis indicates that $R_{beam}$ should be maximized so that power loss to the substrate is minimized, but this requires reduction of $C_{beam}$ in order to allow fast temperature fluctuations in the transducer.

Figure 2A:
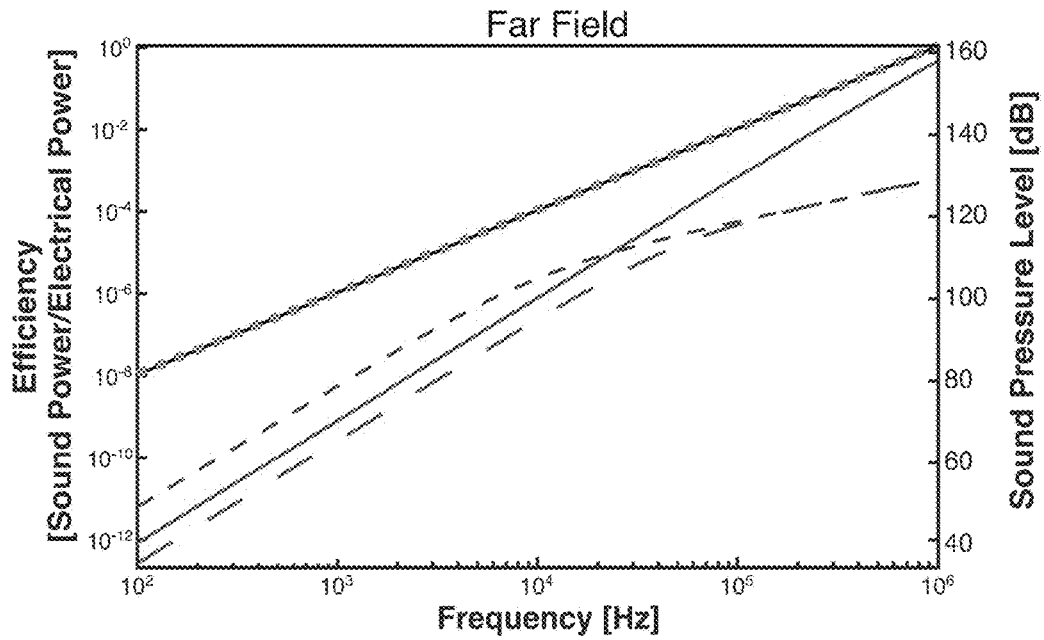
FIGS. 2A-2B illustrate non-limiting model results for applied power of 9.5 W/cm² (device total 10 W) from one of the 17-μm nanobridge transducer arrays described herein.
Figure 2B:
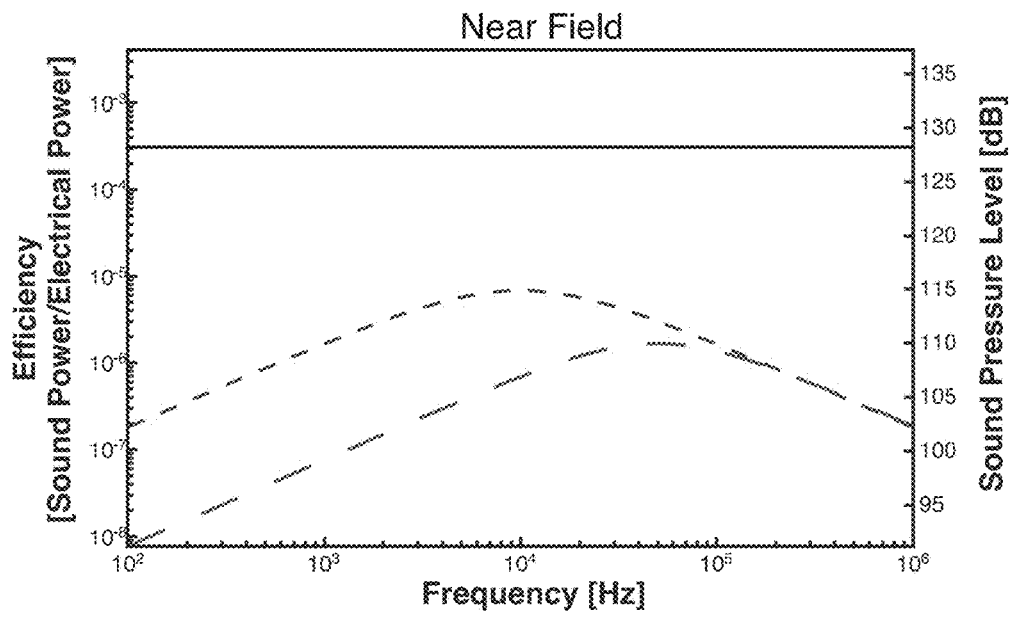

Although the input power appears in the denominator in Eq. 4, when Eq. 16 is carried through Eqs. 17-18, the result is that $P_{AC}$ is in the numerator and $\eta \propto P_{AC}$, similar to Eqs. 1 and 2. If the contributions of Eqs. 13-14 are omitted from Eq. 16, and if sound emission from only one surface is assumed, then Eqs. 4 and 16-18 can be simplified to recover Eq. 2. FIGS. 2A-2B examines sound generation efficiency under several conditions. When there are no losses to the substrate through the beam or conduction through air, the sound output is near the maximum calculated from Eq. 2 (FIG. 2A, "Wave Emission Only"), with $\eta \propto f^2$. Losses in the beam decrease the overall efficiency yet in the near field (FIG. 2B) maintain a relatively flat efficiency frequency response. Inclusion of conduction through the air gap to the substrate significantly decreases the low frequency output. In the prior art, it was often assumed that heat flux through the ends of beams is negligible. However, if beams are of finite length and end at anchor points that serve as heat sinks, as is the case with microfabricated designs, thermal losses through the ends of beams reduce η and the model presented here shows that η decreases as beam length is reduced. Energy loss across the suspension gap to the substrate is a much greater effect, though, and dominates beam design effects at low frequencies. For f>~30-50 kHz, losses due to heat capacity in the beam begin to dominate the spectral response.

Many parameters in Eqs. 16-18 are constants, therefore the only mechanisms available to improve η are to increase $P_{AC}$, increase $R_{beam}$ and $R_{air}$, decrease $C_{beam}$, and otherwise select the beam dimensions to maximize u and $T_{AC}$. Ultimately the thermal coupling to the ambient fluid limits the possible acoustic frequency performance of thermoacoustic devices to the efficiencies calculated with Eqs. 1-2. Eq. 2 indicates that a freestanding tungsten film in air can at best achieve η=~$10^{-3}$ if it is operated with peak temperatures greater than 3000 K. The one major parameter able to move η to values competitive with commercial loudspeakers (e.g., η≈0.001 to 0.1) is the ambient temperature. Setting $T_0$=20 K in Eq. 2 and keeping all other parameters constant indicates η≈0.001 to 0.01 could be possible for freestanding thermoacoustic devices. In certain embodiments, encapsulation and choice of fluids other than air can increase η, but can increase manufacturing complexity in certain cases.

Compositions

The invention provides a nanodevice, which in certain embodiments is a thermal and/or thermoacoustic nanodevice.

In one aspect, the nanodevice comprises a solid substrate. In certain embodiments, the solid substrate comprises at least one selected from the group consisting of silica, alumina, glass, metal, silicon, semiconductor, electrical insulator, vitreous carbon, plastic, polymer, elastomer, fabric, paper, plastic, and nanofibrous article.

In another aspect, the nanodevice comprises a first solid supporting material block and a second solid supporting material block. The blocks serve to suspend the beams above the surface of the solid substrate. In certain embodiments, the first and second supporting material blocks are in physical contact with the same surface of the solid substrate. In other embodiments, the section of the solid substrate defined inbetween the first and second supporting material blocks does not comprise an additional supporting material block. In yet other embodiments, the section of the solid substrate defined inbetween the first and second supporting material blocks is essentially free from the supporting material. In yet other embodiments, the section of the solid substrate defined inbetween the first and second supporting material blocks has a coating of supporting material which has lower thickness than the thickness of the first or second supporting material blocks In certain embodiments, the solid supporting material layer is deposited using at least one selected from the method consisting of molecular layer deposition (MLD), atomic layer deposition (ALD), spin-coating, spray coating, contact adhesion, casting, evaporation, and sputtering. In other embodiments, the solid supporting material layer comprises at least one selected from the group consisting of a polyimide, polydimethylsiloxane, polystyrene, epoxy, polypropylene, poly(methyl (meth)acrylate), polyethylene, poly(vinyl chloride), polycaprolactone, polyethylene terephthalate, polyvinyl alcohol, polysaccharide, chitin, polypeptide, and polylysine.

The thickness of the solid supporting material blocks is equal to or less than about 1,000 µm, 800 µm, 600 µm, 400 µm, 200 µm, 100 µm, 50 µm, 40 µm, 30 µm, 20 µm, 10 µm, 8 µm, 6 µm, 4 µm, 2 µm, or 1 µm. In certain embodiments, the first and second supporting material blocks have approximately the same thickness. In other embodiments, the first and second supporting material blocks are approximately parallel to each other.

In yet another aspect, the nanodevice comprises at least one ultrathin film block ("bridge") comprising a first face and an opposite second face. In certain embodiments, the at least one ultrathin film blocks has an average thickness that is equal to or lower than about 50 nm, equal to or less than about 40 nm, equal to or less than about 30 nm, equal to or less than about 20 nm, equal to or less than about 10 nm, equal to or less than about 5 nm, equal to or less than about 2 nm, or equal to or less than about 1 nm. In other embodiments, the at least one ultrathin film block has an average length that ranges from about 50 nm to about 1,000 µm, or from about 50 nm to about 100 µm. In yet other embodiments, the at least one ultrathin film block has an average width that ranges from about 10 nm to about 10 µm, or about 10 nm to about 50 µm.

In certain embodiments, the first face comprises a material nucleation layer. In other embodiments, the opposite second face comprises an electrically conducting layer. In yet other embodiments, a section of the first face of each ultrathin film block is in physical contact with the first supporting material block. In yet other embodiments, a distinct section of the first face of each ultrathin film block is in physical contact with the second supporting material block, such that each ultrathin film block spans the width of the section of the solid substrate defined inbetween the first and second supporting material blocks. In yet other embodiments, the at least one ultrathin film block does not have physical contact with the solid substrate, such that the at least one ultrathin film block is suspended over the solid substrate.

In certain embodiments, the at least one ultrathin film block is prepared using a manufacturing method comprising ALD. In other embodiments, the manufacturing method further comprises atomic layer etching (ALE). In yet other embodiments, the ceramic layer and the metal layer are prepared using a method comprising ALD. In yet other embodiments, the at least one ultrathin film block comprises at least one selected from the group consisting of a metal, metal oxide, semimetal, semiconductor, alkoxide polymer, polyamide, and metal nitride. In yet other embodiments, the ceramic layer comprises at least one selected from the group consisting of $Al_2O_3$, $GeO_2$, $HfO_2$, indium tin oxide, $RuO_2$, SiC, SiGe, $SiO_2$, $Si_3N_4$, AlN, BN, GaN, diamond, $SnO_2$, $TaN_x$, $TaO_x$, TiC, TiN, $TiO_2$, $V_2O_5$, $VO_x$, ZnO, ZnS, and $ZrO_2$. In yet other embodiments, the metal layer comprises at least one selected from the group consisting of Ag, Al, Au, Co, Cu, Fe, Ge, Ir, Mo, Ni, Os, Pd, Pt, Rh, Ru, Si, Ta, Ti, and W.

In yet another aspect, the nanodevice comprises a first conductive block, which has physical and electrical contact with a section of the second face of the at least one ultrathin film block which is approximately opposite to the section of the corresponding first face that is in physical contact with the first supporting material block; and a second conductive block, which has physical and electrical contact with a section of the second face of the at least one ultrathin film block which is approximately opposite to the section of the corresponding first face that is in physical contact with the second supporting material block. In certain embodiments, the first and second conductive blocks are independently selected from the group consisting of Al, Ti, Cu, Ni, Ta, Cr, Ag, Mo, and Au.

In certain embodiments, the conductive blocks have an average thickness that ranges from about 20 nm to about 1,000 nm.

In certain embodiments, the nanodevice of the invention is at least partially immersed in a fluid, which can be a gas and/or a liquid. When a stimulus is applied to the first and conductive blocks, the at least one ultrathin film block undergoes temperature changes. The stimulus can be an energy form selected from the group consisting of electrical current, electromagnetic radiation (such as, for example, visible light, microwave, infrared and/or ultraviolet), energetic particles (such as, for example, ions, atoms, atomic clusters, and/or cosmic rays), and subatomic particles (such as, for example, electron, neutron, beta particle, alpha particle and/or proton). The temperature changes experienced by the at least one ultrathin film block promote propagation of pressure waves (sound) in the surrounding fluid.

Methods

The invention provides a method of preparing the nanodevice of the invention. In certain embodiments, the method comprises depositing a layer of solid supporting material on at least a section of the solid substrate. In other embodiments, the method comprises depositing a ceramic layer on at least a section of the surface of the solid supporting material using ALD. In yet other embodiments, the method comprises depositing a metal layer on the deposited ceramic layer using ALD. In yet other embodiments, the method comprises patterning the width and length of the at least one ultrathin film block on the surface of the ALD-deposited ceramic and metallic layers using etching. In yet other embodiments, the method comprises depositing and patterning the first and second conductive blocks, such that the first conductive block physically and electrically contacts one exposed length-wise extremity of the surface of the at least one patterned ALD-deposited layer, and the second conductive block physically and electrically contacts the opposing exposed length-wise extremity of the surface of the at least one patterned ALD-deposited layer. In yet other embodiments, the method comprises removing the exposed solid supporting material through etching, so as to allow the resulting at least one ultrathin film block to be suspended over the solid substrate. In yet other embodiments, the etching comprises $O_2/CF_4$ reactive ion etching and/or isotropic $O_2$ plasma etching.

The invention further provides a method of generating thermal, pressure and/or sound waves using a nanodevice of the invention. The method comprises applying a stimulus (which can be alternating, continuous, or any combinations thereof) to the first and conductive blocks of a nanodevice of the invention that is at least partially immersed in a fluid, which can be a gas and/or a liquid. The stimulus can be an energy form selected from the group consisting of electrical current, electromagnetic radiation (such as, for example, visible light, microwave, infrared and/or ultraviolet), energetic particles (such as, for example, ions, atoms, atomic clusters, and/or cosmic rays), and subatomic particles (such as, for example, neutron, beta particle, alpha particle and/or proton). Such stimulus causes the at least one ultrathin film blocks to undergo temperature changes. The temperature changes experienced by the at least one ultrathin film block promote formation of thermal and/or pressure waves (sound) in the surrounding fluid.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "ALD" refers to atomic layer deposition, which is a thin film deposition method. In certain embodiments, the term "thin" refers to a range of thickness from about 0.1 nm to about 300 nm. ALD uses a self-limiting reaction sequence that deposits films in discrete steps limited by surface site chemical reactions. It produces continuous films with atomically controlled thicknesses, high conformality, and typically pinhole-free and atomically smooth surfaces. These are essential properties as design constraints push device technologies to ever smaller sizes. In certain embodiments, molecular layer deposition (MLD) is a non-limiting example of ALD. In other embodiments, materials prepared using ALD include materials prepared using MLD. In yet other embodiments, MLD comprises depositing an alkoxide polymer on a substrate. In yet other embodiments, MLD comprises generating a polymer by alternating reactions of chemicals selected from a first and a second group; wherein the first group includes, but is not limited to, trimethyl aluminum, titanium tetrachloride, and diethyl zinc; and wherein the second group includes, but is not limited to, ethylene glycol, propylene glycol, glycerol, hydroquinone, 1,2-ethanedithiol, and 1,3-propanedithiol.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "µm" is the abbreviation for "micron" or "micrometer", and it is understood that 1 µm=0.001 mm=$10^{-6}$ m=1 millionth of a meter.

As used herein, the term "nanodevice" refers to a device that has at least one component with at least one spatial dimension less than 1 micron.

As used herein, the term "nm" is the abbreviation for "nanometer" and it is understood that 1 nm=1 nanometer=$10^{-9}$ m=1 billionth of a meter.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Materials & Methods
Sound Field Simulation

Figure 9:
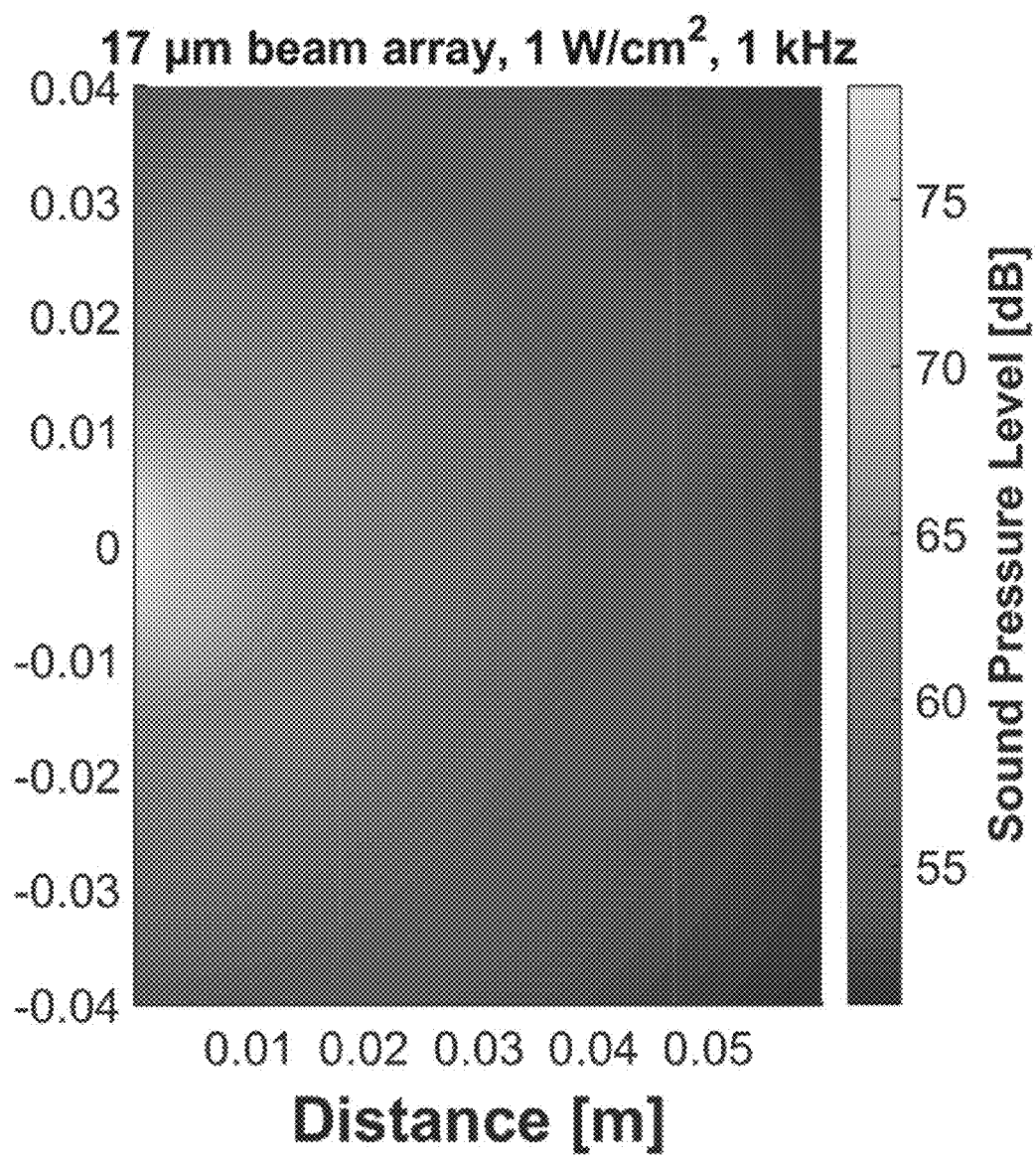
FIG. 9 is an image illustrating an output sound field from an array of 576,000 beams 17 μm×2 μm in size, emitting 0.195 W total power at 1 kHz, viewed in the XZ plane with the emitter at left. Field is an interpolation of a 36×18 point grid, with each point value calculated according to the method of Bouman, et al., 2016, J. Acoust. Soc. Am. 139:1353-63.
Figure 10:
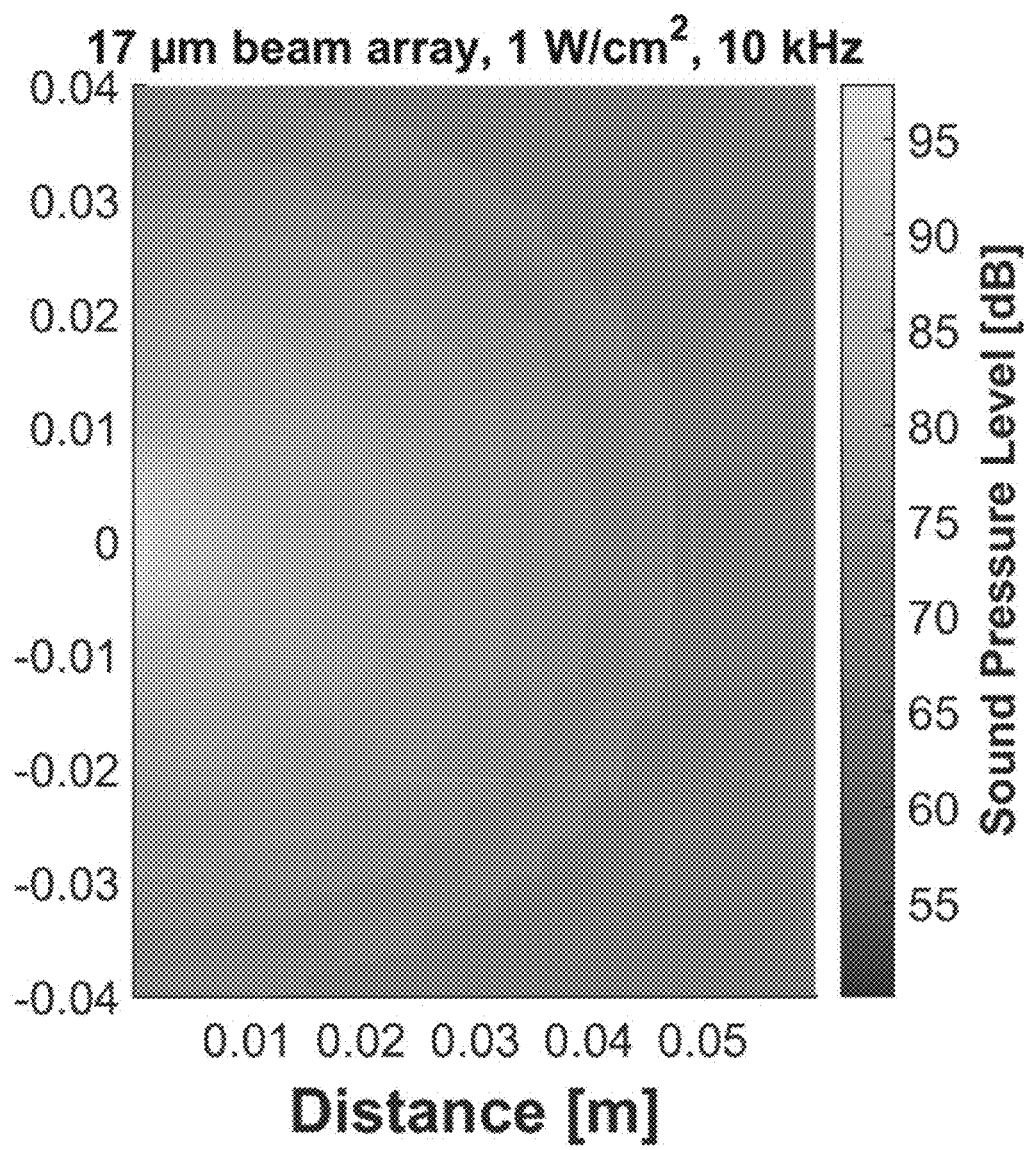
FIG. 10 is an image illustrating output sound field from an array of 576,000 beams 17 μm×2 μm in size, emitting 0.195 W total power at 10 kHz, viewed in the XZ plane with the emitter at left. Field is an interpolation of a 36×18 point grid, with each point value calculated according to the method of Bouman, et al., 2016, J. Acoust. Soc. Am. 139 1353-63.
Figure 11A:
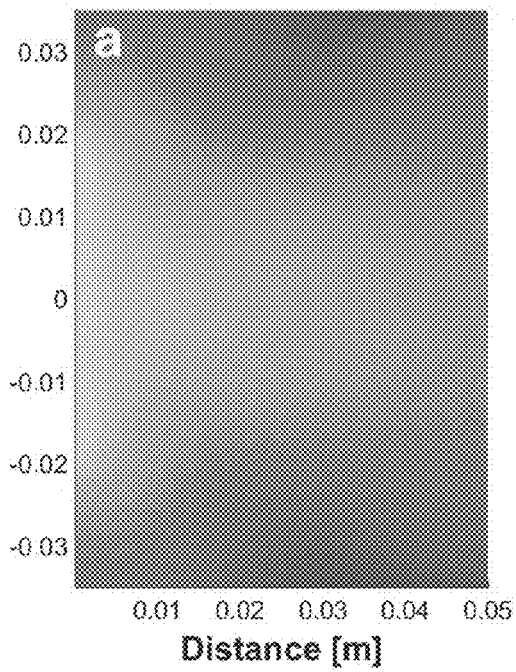
FIGS. 11A-11D are a series of images illustrating phased array sound field calculation, 10 kHz, of three thermoacoustic emitter chips, centered at (0, +15 mm), (0, 0), and (0, −15 mm), with sound emission from the left of each plot, moving to the right. Each device sound field is calculated from an array of 576,000 17 μm×2 μm beams emitting 1 W/cm² at 10 kHz, viewed in the XZ plane with the emitter at left. Vertical and horizontal axes show distance in each sound field.
Figure 11B:
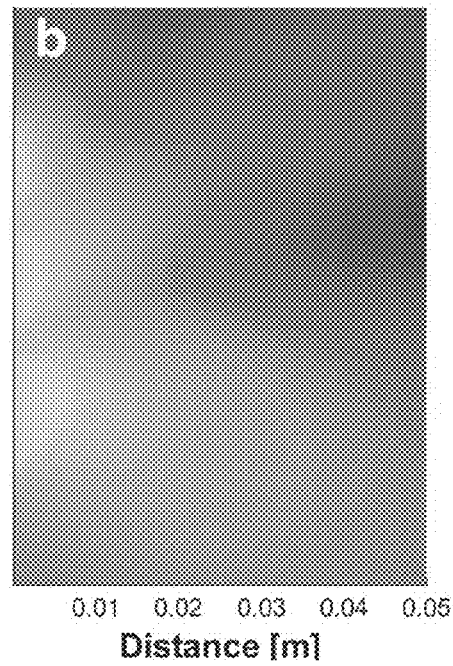
Figure 11C:
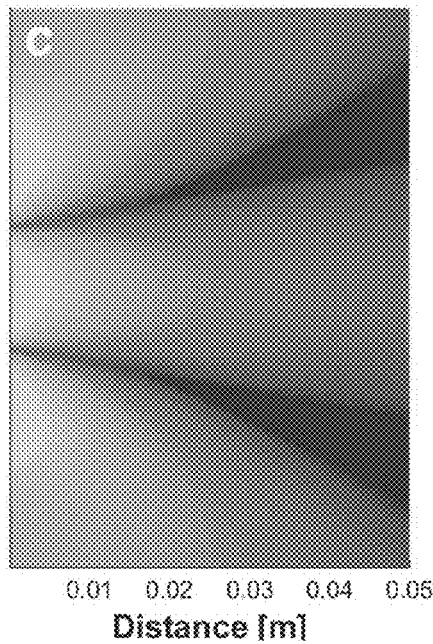
Figure 11D:
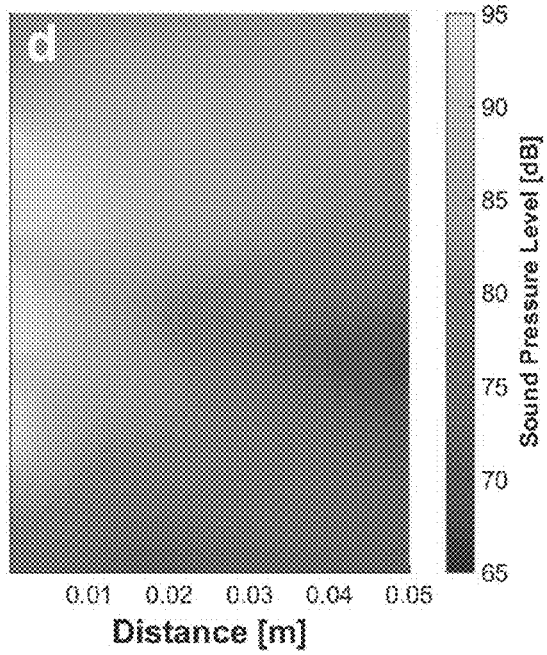

Eqs. 6-8 allow calculation and plotting of the sound field of a thermoacoustic point. FIGS. 9-10 show results in the XZ plane for 1 kHz and 10 kHz output, respectively, for a single 17 μm×3 μm array source.

Phased Array Simulation

Phased array behavior of multiple devices in close proximity was investigated by superimposing the sound field, shifted in location and temporal phase, over one another. This was simulated with three devices placed at regular intervals along the Z-axis of FIGS. 11A-11D. The phase variation was described by [$\phi_1$ $\phi_2$ $\phi_3$], where $\phi_1$ is the phase shift of the top emitter and varies from 0° to −360°, $\phi_2$ is fixed at 0°, and $\phi_3$ is the phase shift of the bottom emitter and varies from 0° to +360°. The phase of the three devices was varied in these ranges to illustrate variation in directivity that may be obtained from thermoacoustic devices. Because thermoacoustic devices do not use capacitive or inductive transduction, control of the output phase can be more readily achievable across a broad range of frequencies than with other transduction mechanisms.

Spectrograms of Audio Files

Figure 12:
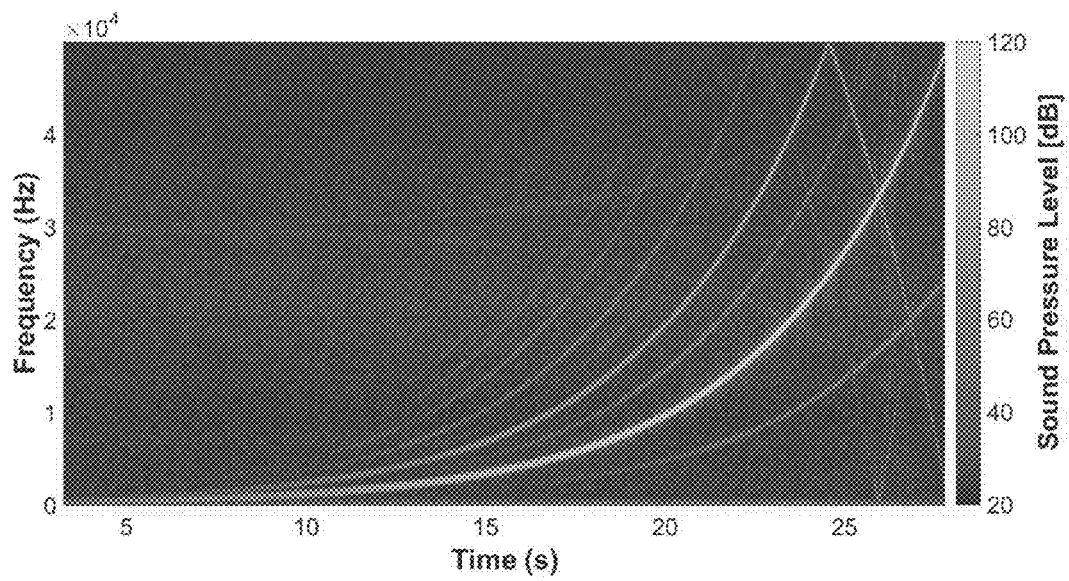
FIG. 12 is a graph illustrating a spectrogram of sound output up to 25 kHz input with clear second harmonic. Input: 50 Hz-25 kHz unbiased logarithmic chirp frequency sweep. Chip output: 100 Hz-50 kHz. Measured at 1 cm distance. Aliasing was present in harmonics because data was sampled at 100 kHz, giving a Nyquist limit of 50 kHz.
Figure 13:
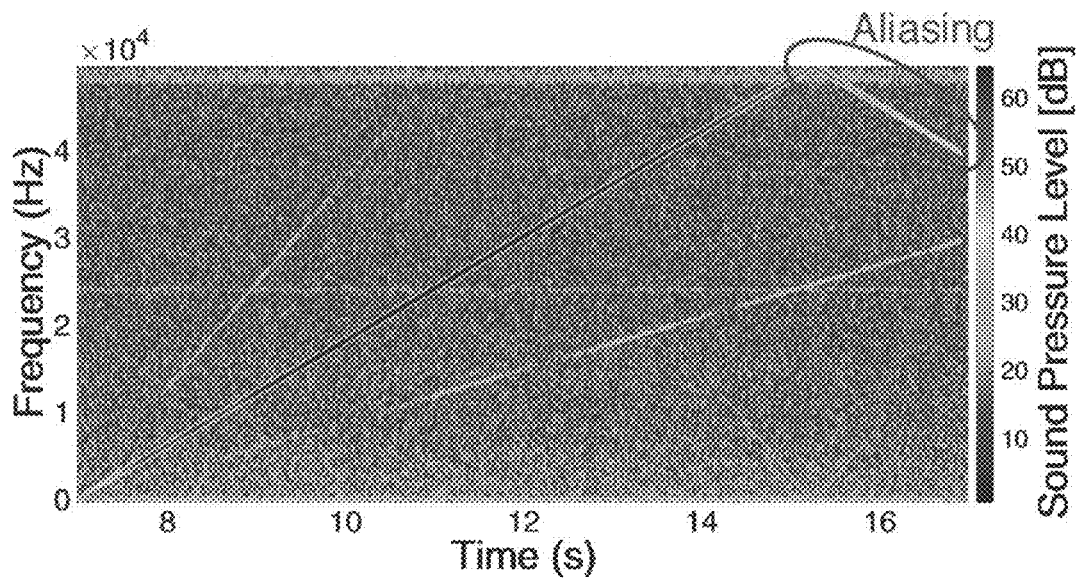
FIG. 13 is a graph illustrating a spectrogram of sound output up to 30 kHz input. Input: 50 Hz-30 kHz unbiased linear chirp. Chip output: 100 Hz-60 kHz. Measured at 5 cm microphone distance from device (add 14 dB for 1 cm equivalent). Aliasing is present where the chip output exceeded the 50 kHz Nyquist limit.
Figure 14:
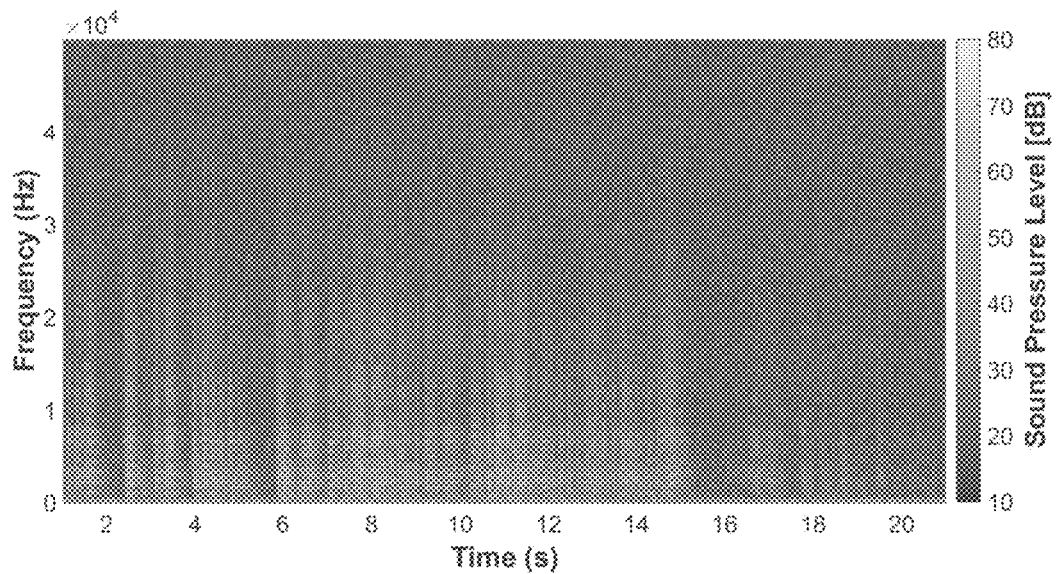
FIG. 14 is a graph illustrating a spectrogram of Mozart's *Eine kleine Nachtmusik* Movement 1 played through a thermoacoustic nanodevice. A 10 Volt DC bias is added to the audio signal so that frequency doubling is mitigated and sound quality preserved.

Illustrated in FIGS. 12-13 are spectrograms of logarithmic and linear chirps recorded from the devices. A logarithmic chirp is a frequency sweep in which octaves vary linearly with time. In a linear chirp, just the frequency varies linearly with time. FIG. 14 illustrates a spectrogram relating to Mozart's *Eine kleine Nachtmusik* Movement 1 played through a device of the invention.

Additional Experimental Details

Figure 15A:
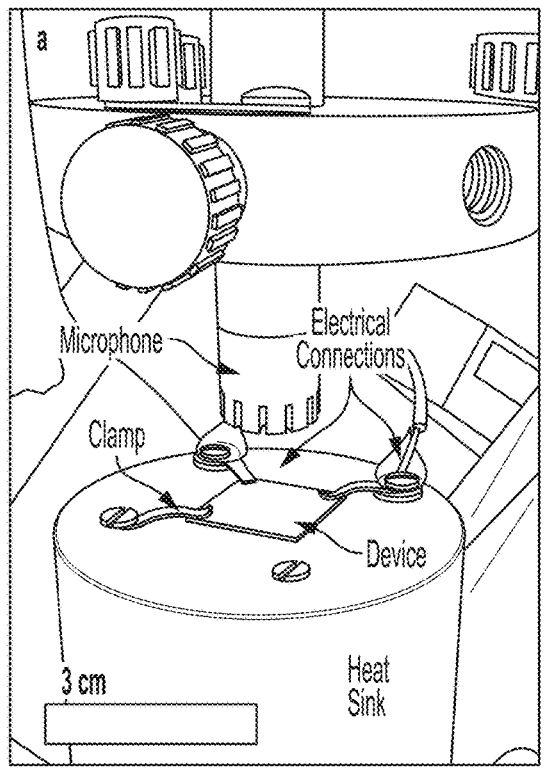
FIGS. 15A-15B illustrate a non-limiting near-field experimental setup in anechoic chamber used for data collection.
Figure 15B:
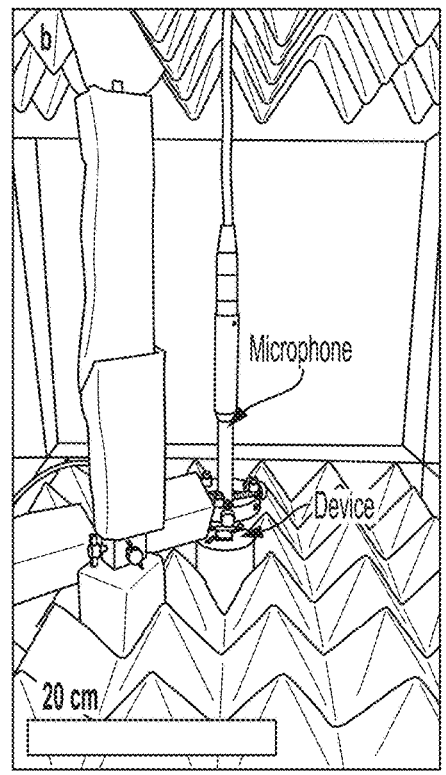
Figure 16A:
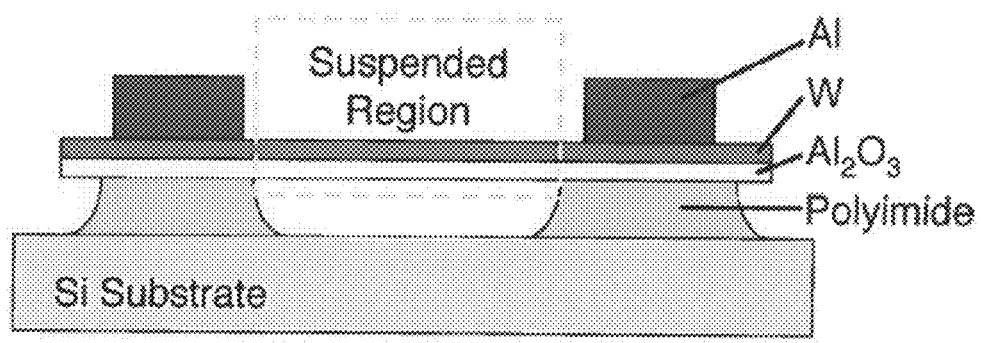
FIG. 16A is a non-limiting illustration of a cross-section diagram of a fabricated nanodevice of the invention. In certain embodiments, the polyimide layer is about 3.5 μm thick, the $Al_2O_3$ layer is about 6.5 nm thick, the W layer is about 19.3 nm thick, and the Al layer is about 500 nm thick.
Figure 16B:
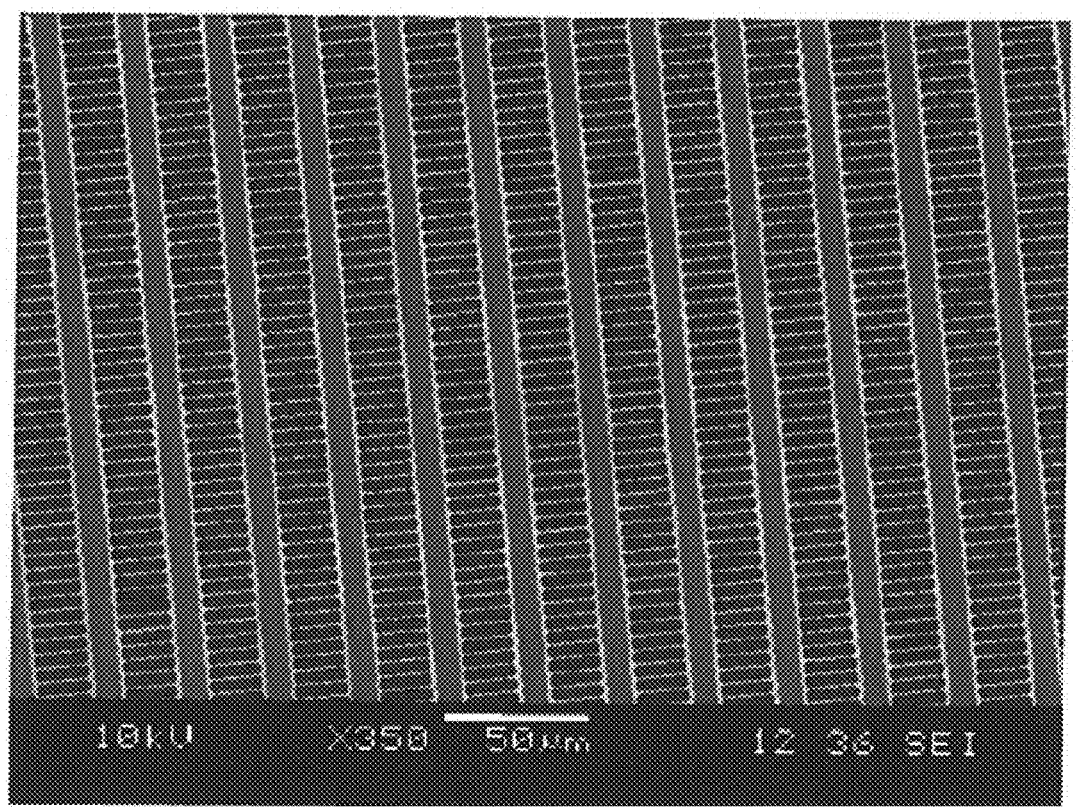
FIG. 16B is a SEM image of an array of suspended microbridges used for thermoacoustic sound generation.

The anechoic chamber used for device characterization is pictured in FIGS. 15A-15B. At frequencies higher than about 300 Hz, a noise floor of around 10 dB was observed. Low frequency noise is present due to the laboratory environment. Tables 1-2 provide a list of the variables and parameters used in calculations.

TABLE 1

Air and film property values for input to lumped element model.

| Symbol | Quantity | Unit | Description |
|---|---|---|---|
| $c_{p,f}$ | 460 | J/(kg K) | Specific heat of Tungsten film |
| $c_{p,g}$ | 1,005 | J/(kg K) | Specific heat of air, 293 K |
| $C_f$ | 0.18 | J/(m² K) | Heat capacity per unit area of 20 nm layer of Tungsten |
| $T_o$ | 293 | K | Ambient air temperature |
| $v_g$ | 334 | m/s | Speed of sound in air, 1700 meter elevation |
| $\alpha_g$ | 2.3 × 10⁻⁵ | m²/s | Thermal diffusivity of air, 293 K |
| $\kappa_f$ | 20 | W/(m K) | Thermal conductivity of Tungsten film |
| $\kappa_g$ | 0.026 | W/(m K) | Thermal conductivity of air, 293 K |
| $\rho_f$ | 1.9 × 10⁴ | kg/m³ | Density of Tungsten film |
| $\rho_g$ | 1.0 | kg/m³ | Density of air, 1700 meter elevation |

TABLE 2

Physical device parameters for input to lumped element model.

| Symbol | Quantity | Unit | Description |
|---|---|---|---|
| $A_o$ | 1.05 × 10⁻⁴ | m² | Device emission area |
| $d_n$ | 5 × 10⁻⁶ | m | Beam pitch |
| g | 1.5 | m | Gap height between beam and substrate |

TABLE 2-continued

Physical device parameters for input to lumped element model.

| Symbol | Quantity | Unit | Description |
|---|---|---|---|
| $L_b$ | $1.7 \times 10^{-5}$ | m | Microbridge beam length |
| L | 4 | | Beam arrays on device |
| M | 72 | | Beam rows in an array |
| N | 2000 | | Beams in a row |
| $W_b$ | $2 \times 10^{-6}$ | m | Beam width |
| $\delta_f$ | $20 \times 10^{-9}$ | m | Thickness of Tungsten film |

Example 1

Device Design and Fabrication

Nanobridge arrays were designed such that series and parallel connections would allow a total electrical resistance of 10-20Ω. A 500-nm metal layer was deposited on the W nanofilm in order to provide electrical contact pads and to distribute electrical power throughout the array. Initial demonstration used 500 nm Al as the metal electrical distribution layer, and additional rounds of fabrication used 20 nm Ti with 500 nm Au in order to improve electrical contact to the device arrays. Four design variations were fabricated and tested, Table 1. The fabrication process is illustrated in FIG. 1, Panel e. All designs were fabricated with ALD of 6.5 nm $Al_2O_3$ and 19.3 nm W. These materials were chosen due to availability and good temperature tolerance. FIG. 1, Panel a, provides an example of a fabricated chip. The RIE device patterning step tended to overetch the pattern, e.g. 1-μm-width bridges were generated from 2 μm patterns.

TABLE 3

Fabricated device designs. Temperature fluctuation amplitude values were calculated at 10 kHz for 10 W electrical power input using Eq. 16.

| Beam Length [μm] | Nominal Beam Width [μm] | Number of Transducer Beams in a Device | Measured Device Impedance [Ω] | Temperature Fluctuation Amplitude [K] |
|---|---|---|---|---|
| 17 | 2 | 576,000 | 20.66 | 8.8 |
| 50 | 2 | 272,000 | 16.68 | 7.6 |
| 200 | 3 | 40,000 | 20.27 | 6.8 |
| 600 | 3 | 12,000 | 19.26 | 7.6 |

Acoustic Characterization

An anechoic chamber with 0.46 m×0.46 m (18"×18") base and 0.38 m (15") height was built using at least 0.15 m (6") of open cell foam on all sides, of which 0.076 m (3") were pyramid-shaped. These dimensions allow sound isolation for frequencies above ~500 Hz. Ambient noise at lower frequencies remained detectable within the chamber. An Agilent 33250A function generator and other tone generation software provided input signals. The current delivered to the device tested was determined by monitoring the voltage across a high-precision 1Ω resistor in series with the transducer; sound waves were recorded (FIG. 15) by a calibrated (Cross-Spectrum Acoustics, Inc., Springfield, Mass., USA) measurement microphone (Dayton Audio EMM-6) with sensitivity 12 mV/Pa, driven by a 48 V phantom power supply (Audio Technica), with the microphone located 1 cm above each device under test. Data were collected by an NI USB-6259 at 100 kHz sampling frequency, and recorded with LabVIEW software. Device arrays on 15 mm×15 mm chips were measured for acoustic performance by supplying a signal from the function generator to an audio amplifier (Dayton APA150), which in turn supplied the electrical signal to the device chips. A low-cost voice coil speaker (part COM-10722, 0.25 W rated power, from sparkfun dot com) was used for spectral comparisons.

Acoustic Noise Floor Calculation

Figure 6:
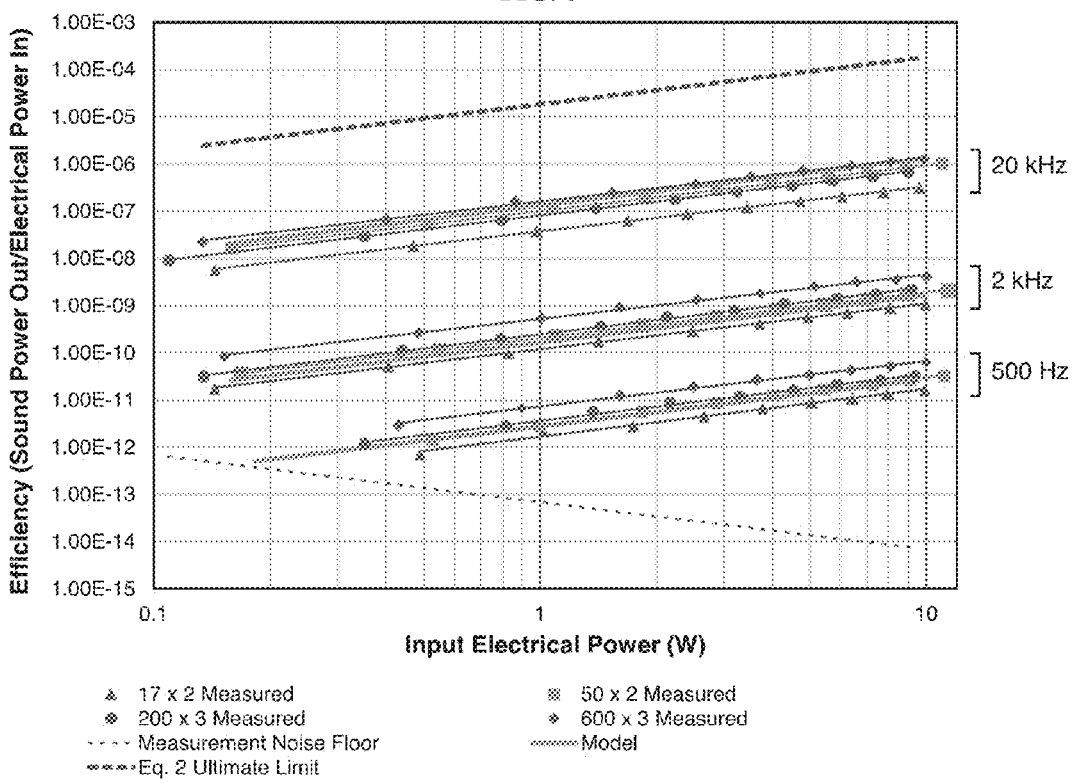
FIG. 6 is a graph illustrating efficiency comparison for frequency and design. This plot shows efficiency for varying designs, input powers, and frequencies. Fit lines connect the measured data points.

For calculation of the efficiency noise floor plotted in FIG. 6, a recording of silence in the anechoic chamber was used. A characteristic noise SPL at 500 Hz was calculated by averaging the SPL±50 Hz from 500 Hz. This SPL was used to determine a sound intensity, which in turn allowed the calculation of a sound power. Spherical wave sound propagation was assumed for all calculations. Finally, the noise floor of the efficiency was determined by dividing the constant sound power by a range of input power values, leading to a floor that decreases with input power. In FIG. 6, this noise floor shows the minimum detectable efficiency with varying input power.

Data Analysis

Data analysis was performed in MATLAB software according to standard discrete mathematics techniques (Oppenheim, et al., 1999, *Discrete Time Signal Processing* (Upper Saddle River, N.J., USA: Prentice Hall) For white noise and single tone analysis (used in frequency sweep and maximum output calculations), spectra were generated with the windowed periodogram method. In this method, data segments of 2048 samples were processed. To remove low-frequency noise, the DC mean of each segment was subtracted, and then each segment was digitally filtered by a Chebyshev Type II infinite impulse response (IIR) high pass filter with 120 Hz passband frequency. Each segment was windowed with a Blackman window equal to the segment length, and converted to frequency domain with a zero-padded fast Fourier transform of length 32,768. The frequency-domain microphone voltage was converted to sound pressure level (SPL) values across the frequency spectrum. For single-tone and white noise plots, the final plots were averages of SPL spectra from 16 data segments. The microphone calibration data provided by Cross-Spectrum (Springfield, Mass.) was not used to adjust these plots, as initial analysis explored spectral results up to 50 kHz and calibration was performed up to only 25 kHz. As a consequence, the plotted white noise data may deviate ±2.9 dB from actual values. For spectral analysis of frequency chirp files, processing was similar to that described above, except that processed segments were not averaged, and were instead selected from a data window that moved forward through the chirp file. After the SPL calculation, the peak value was recorded, adjusted by the microphone calibration file provided by Cross-Spectrum (Springfield, Mass.) and sorted into its corresponding frequency bin, with an average value of recorded data calculated for bins containing data from more than one data segment.

The digital signal processing toolbox available with MATLAB was used to perform ⅓ octave band analysis (3 bands per octave) of pink noise output. The function "f.designoctave" was used to produce a bank of digital bandpass filters that conformed to octave band analysis standards. These were $10^{th}$ order Class 1 Butterworth digital filters (allowing ±0.3 dB of ripple in the passband), and the center frequency of each filter corresponded to the standard center frequencies used for ⅓ octave band analysis in the audible range. The data were processed by each of the 30 bandpass filters; the rms voltage of each output was calculated and used to determine the rms pressure of each octave with the microphone's sensitivity. These pressure values were then converted to sound pressure level.

Example 2

Device Design and Operation

Thermoacoustic loudspeaker chips were designed and fabricated (Table 3) as a balance among efficiency, electrical power consumption, sound output, manufacturability, and packaging. FIG. 1, Panel a, shows an operational nanobridge array thermoacoustic loudspeaker, with a secondary optical diffraction effect visible due to the presence of large arrays of nanobridges with widths near the wavelengths of visible light. FIG. 1, Panel c, shows a portion of an array of nanobridges fabricated by ALD and used for thermoacoustic sound production, and FIG. 1, Panel d, provides an example cross-section of these devices.

Spectral Analysis

Figure 3:
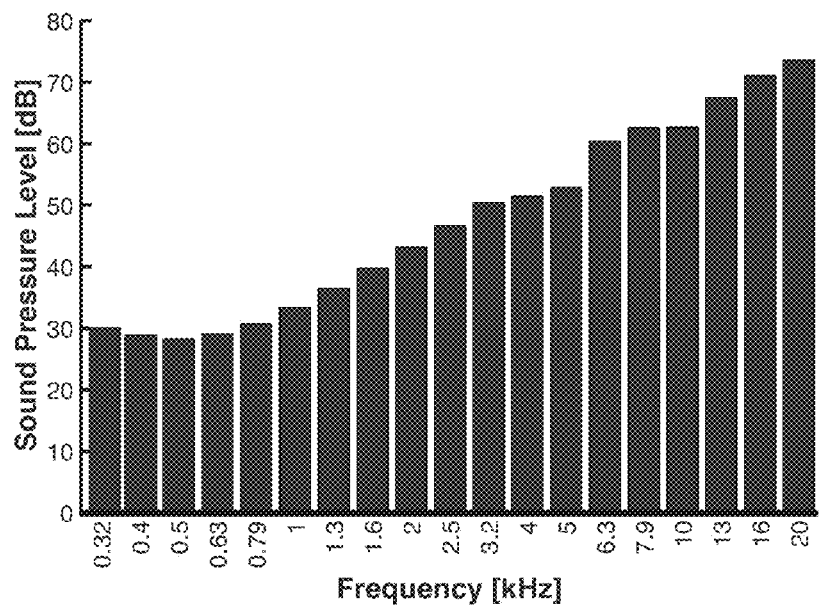
FIG. 3 is a bar graph illustrating ⅓ octave band analysis of pink noise input to a tested device comprising an array of 600 μm×3 μm beams. In this figure, lower frequencies have been omitted because of environmental noise. Frequencies labeled on plot are center frequencies of bandpass filters. Input power is 0.325 W, with 19.26Ω device impedance.
Figure 4:
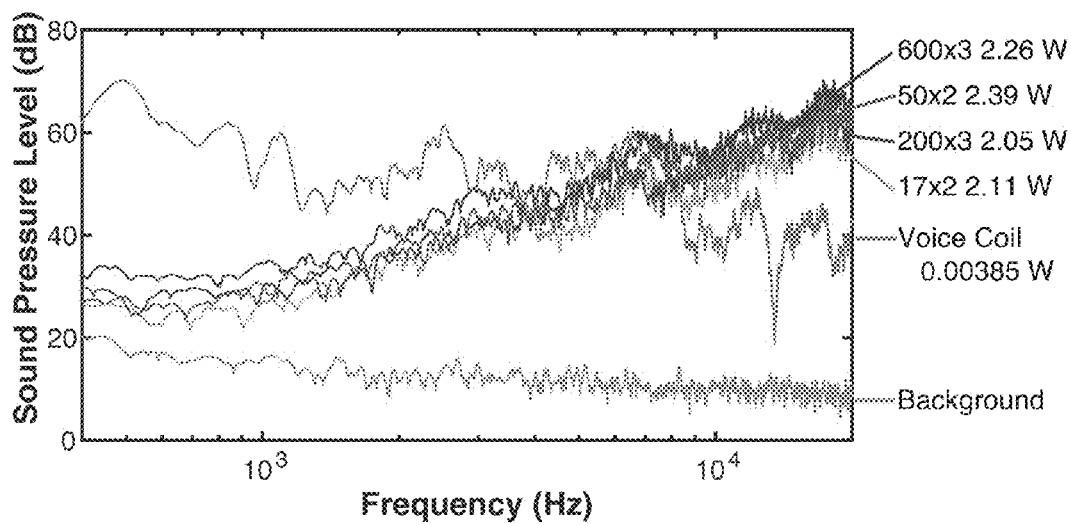
FIG. 4 is a graph illustrating white noise spectral output for thermoacoustic nanobridge array devices of varying length (μm)×width (μm), compared with a conventional voice coil speaker 37 mm in diameter.

In audio transduction, a flat frequency response is generally desired for good sound reproduction across the audio spectrum. In order to characterize and verify the frequency response of nanobridge thermoacoustic transducers, three types of acoustic frequency spectrum measurements were performed on the ALD thermoacoustic devices. A pink noise signal input allowed a ⅓ octave band analysis, FIG. 3, which is a conventional acoustic measurement. White noise was analyzed by Fourier transform analysis of an output data file, FIG. 4. In a final spectral measurement, a logarithmic frequency sweep (wherein the frequency of a sine wave varies with time) was applied to the devices at constant power. The spectral response from the frequency sweep was reconstructed from the recorded microphone signal via Fourier transforms of windowed sections of the recorded signal, FIG. 5. In all cases, the shape of the output indicated increasing performance of the thermoacoustic chips with increasing frequency, as suggested by the models above. Some small oscillatory deviations from this behavior are visible in the experimental spectra above 2.5 kHz.

Power Variation

The input power to the devices was varied at 500 Hz, 2 kHz, and 20 kHz, in order to test the performance of the devices and the physical models above. FIG. 6 shows the efficiency calculated at various power levels and frequencies for multiple device designs.

A unique characteristic of thermoacoustic devices is that physical analysis predicts that they become more efficient in sound transduction as input power increases (Eqs. 1-2). FIG. 6 confirms this behavior, with the fit lines of the measured data showing η proportional to input electrical power raised to an exponent ranging between 0.94 and 1.02. As illustrated in FIG. 6, as predicted from the model, η increases with f and with input power. There is a linear relationship between η and input power, as expected from analysis, and the magnitude of η predicted by the model is in good agreement with the data.

Without wishing to be limited by any theory, some of the imprecision of the model can lie in omitting the electrical losses due to the conducting traces and anchor regions on the chip, and contact resistance supplying the electrical signal to the chip. Other factors that can lead to deviation of real efficiency from modeled values include packing density of beams, heat conduction to the substrate through anchors, non-ideal gap height, fabrication imperfections resulting in collapsed or damaged beams on some chips, and uncertainty in the power measurement due to inductive phase lag and quantization error.

A portion of the discrepancy between the model and measured data in FIG. 6 is likely due to the gap height between the nanobridges and the underlying substrate. Without wishing to be limited by any theory, processing variations can have led to a smaller gap distance than expected, whether from thinner polyimide than expected, or under-etching of the polyimide during the release step. The result would be to reduce the thermal isolation and increase the thermal loss to the substrate.

Temperature calculation based on Eq. 16, using 10 W input power and f=10 kHz, results in temperature fluctuation amplitudes as reported in Table 3. Adding the peak-to-peak temperature to the ambient value of 293 K (20° C.) used for calculations only brings the peak operating temperature up to about 38° C. For 100 W at 10 kHz, the model predicts 114 dB SPL (at 1 cm distance) and peak temperature up to 197° C. The polyimide, from which tested devices are suspended, fails at ~400° C., therefore the thermal limits of the materials in these devices are much higher than anything yet tested.

Maximum Output

Figure 7:
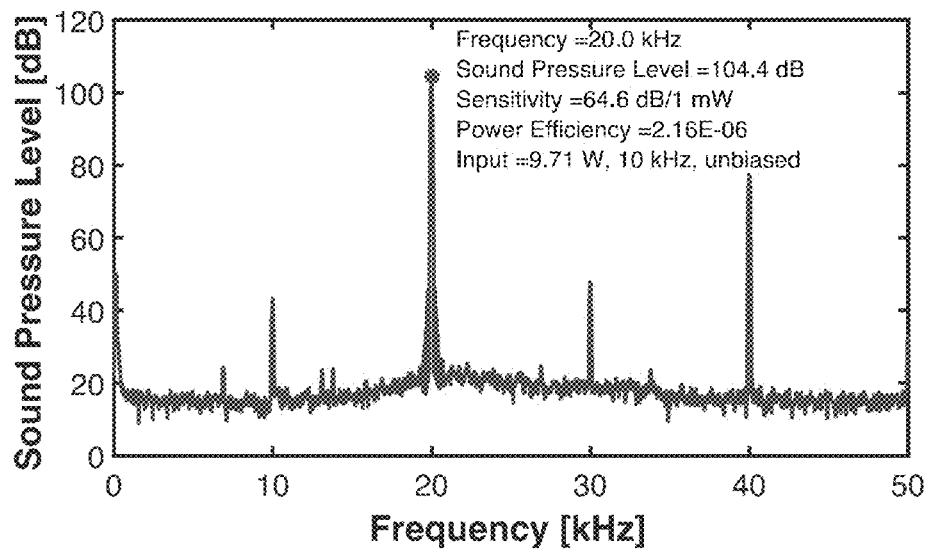
FIG. 7 is a graph illustrating single tone frequency response of one tested chip, which is a device using transducer beams 600 μm×3 μm in size with electrical impedance R=19.26Ω, measured at 1 cm microphone distance, with unbiased 10 kHz input electrical current.

The experimental setup was pushed to observe the maximum sound output from chips. At frequencies >10 kHz, sound pressure levels of 90 to 100 dB were routinely obtained. FIG. 7 shows the best result obtained, using 9.71 W electrical power. The input electrical signal was an unbiased 10 kHz input, resulting in maximum sound pressure at the doubled frequency of 20 kHz. Variation in the device resistance due to the temperature coefficient of resistance may contribute by means of 3ω and 4ω effects to the production of the higher harmonics observed in FIG. 7. For comparison, commercial headphones have loudspeaker sensitivity of ~100 dB per 1 mW, implying they are about 3500× more efficient.

Comments

The fundamental mechanical eigenfrequency $f_0$ of out-of-plane motion of all the suspended beams was above any of the measured frequencies. For suspended, clamped beams under tension due to residual stress, beams of 600 μm length were estimated to have $f_0 \geq$ ~150 kHz. Shorter beams would have even higher $f_0$. It is therefore unlikely that beam mechanical resonance interacted significantly with the thermoacoustic transduction mechanism.

Figure 5:
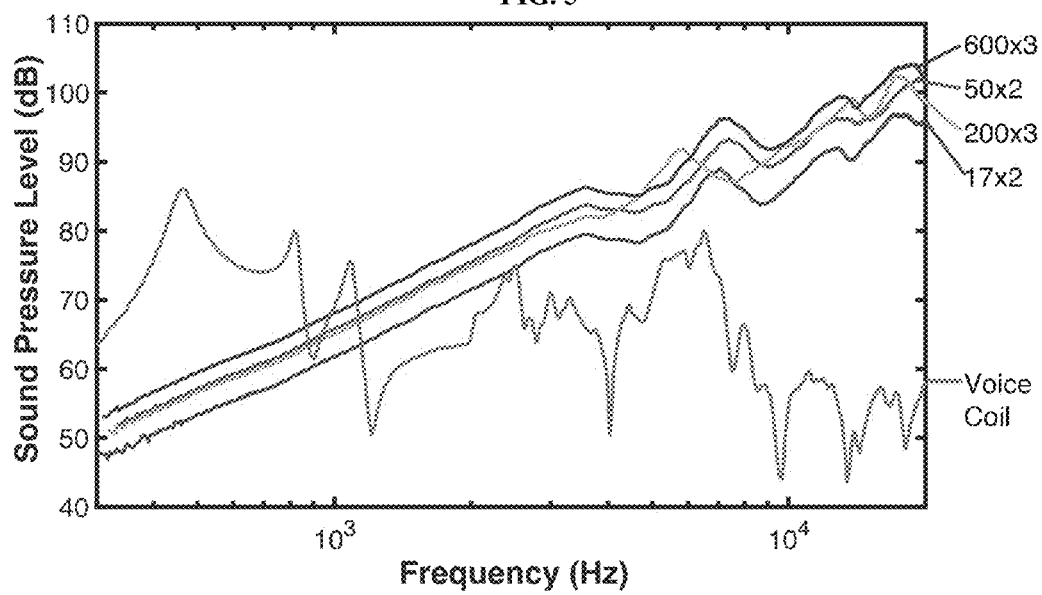
FIG. 5 is a graph illustrating audio spectra constructed from frequency sweep audio files. Measurements were recorded from four different chips representative of beam dimension design variations, and compared with a conventional voice coil speaker 37 mm in diameter provided for reference. Input power for thermoacoustic devices was ~10 W, with device impedances ~20Ω (600×3: 10.6 W, 19.26Ω. 200×3: 10.0 W, 20.27Ω. 50×2: 11.9 W, 16.68Ω. 17×2: 9.9 W, 20.66Ω). The resonant peaks and declining high frequency performance of the voice coil speaker is evident. Also evident is the linearly increasing sound pressure level relative to the frequency, as anticipated by the model in FIG. 2A

The frequency sweep of FIG. 5 provides a means to test the frequency dependence of the model developed. This is performed in FIG. 8, wherein the frequency sweep data are replotted as η vs. f, and compared with the "Wave, Beam, and Substrate" model of FIG. 2A (from Eqs. 4 and 16-18). The perfectly conducting substrate model of Vesterinen et al., 2010, Nano Lett. 10:5020-4 is also plotted in FIG. 8 for comparison, as their model is one of the most comprehensive approaches yet developed for the problem of far field efficiency from suspended thermoacoustic emitters.

The linear portion of the 17×2 data set, between 300 Hz and 3 kHz, was analyzed with linear regression. The regression had $R^2$=0.9979 and yielded Eq. 19 as the empirical relationship between η (dimensionless) and f (in Hz).

$$\eta = \frac{f^{3.1}}{10^{19}} \tag{19}$$

Figure 8:
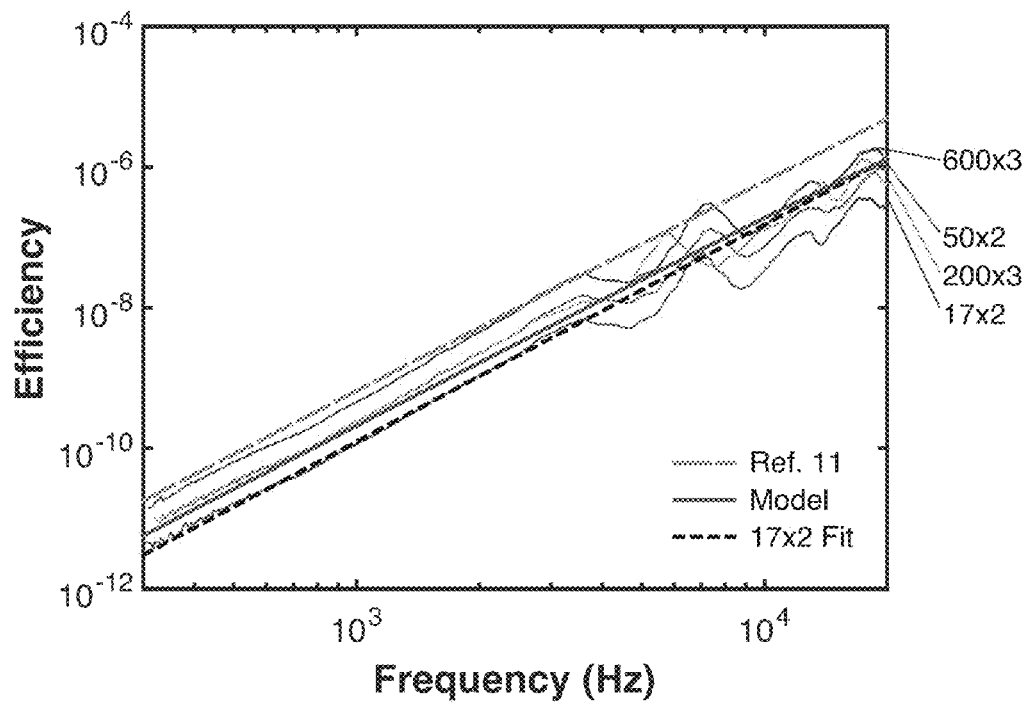
FIG. 8 is a graph illustrating comparison of measurements to models for ~10 W input power. Efficiency calculations were performed on the frequency sweep data reported in FIG. 5. The "17×2 Fit" line is reported as Eq. 19. Far-field models from above ("Model", FIG. 2A, Eqs. 4, 16, 17, and 18, modeled for 17-μm beams) and from Vesterinen et al., 2010, Nano Lett. 10:5020-4 ("Ref. 11", independent of beam length) are provided for comparison.

FIG. 6 provides additional verification of Eq. 19, although it was prepared for comparison of η versus power at three different frequencies. When the data from FIG. 6 are normalized by input power, which is nominally constant for each curve in this data set, the relationship $\eta \propto f^{2.7}$ emerges, providing additional confirmation that η varies proportional to f raised to the power of ~3. As η relates to $p_{rms}^2$ as shown in Eq. 4, Eq. 19 also implies that $p_{rms}$ varies proportional to $f^{3/2}$. Such behavior is found in some of the thermoacoustic literature, with measurements showing $p_{rms} \propto f^\alpha$, where α ranges from 1.3 to 1.5. As seen in FIG. 8, for 10 W input and 1.5 μm gap, between 300 Hz and 3 kHz the model of Vesterinen et al., 2010, Nano Lett. 10 5020-4 predicts $\eta = f^{2.99}/10^{18.2}$ and the lumped element model developed elsewhere herein predicts $\eta = f^{2.99}/10^{18.6}$.

It is also notable that device geometry makes a strong contribution to the spectral output of the devices, as the transition from near-field plane wave propagation to far-field spherical wave propagation moves the modeled frequency dependence from $\eta \propto f^{0.96}$ to $\eta \propto f^3$. Without wishing to be limited by any theory, this suggests that mechanisms to generate plane wave propagation, such as enclosure of small devices in sound propagation channels, or sound generation from large areas, may provide a significant flattening of the spectral response.

In general, the geometry of wave propagation can make a large impact in analysis of acoustic devices, as noted elsewhere herein and in FIG. 2. Under basic consideration of sound propagation from a planar emitter, the Rayleigh distance $R_0 = L_x L_y/\lambda$ estimates the distance at which the propagation of sound transitions from a plane to a spherical wave. In combination with $v_g = f\lambda$, this yields $R_0 = L_x L_y f/v_g$. For the devices presented in the present work, at a maximum frequency of 20 kHz output, $R_0 \approx 6$ mm ($L_x \approx L_y \approx 0.01$ m; f=20 kHz; $v_g = 334$ m/s). Measurements above were performed at 10 mm (>6 mm), indicating a spherical wave propagation model is more accurate than the more-conservative plane wave assumption. On the other hand, in order to infer the transduction efficiency of a single nanobridge beam, the macroscale efficiency data should be scaled by $(r_0/R_0)^2$ in order to transform to a near-field plane wave result.

The Rayleigh distance somewhat oversimplifies of the wave propagation from a planar source according to the piston model. As frequency increases, so does directivity, indicating that the assumption of uniform intensity across a spherical surface in the far field is not fully accurate to calculate the total radiated sound power. When implemented in the model, the directivity flattens the spectral response. Ultimately this leads to the difference between Eq. 1 (spherical) and Eq. 2 (planar) in wave propagation. The efficiency values in FIGS. 2A and 6-8 were not corrected for directivity effects that may be present at higher frequencies. This is due to the fact that a 1-cm distance could correspond to a transition region between planar and spherical wave propagation for much of the range of frequencies tested. For ka<0.5, propagation from an infinite baffle planar loudspeaker behaves like a point source and waves propagate spherically, while for ka>3 the same loudspeaker is highly directional. Here, k is the sound wavenumber and a is the radius of the idealized emitter in the piston model. In the frequencies tested, ka ranged up to a maximum value of 2.

The waves originating from the piston model can fluctuate with increasing frequency if measured insufficiently far from the planar sound source, as wave emission from the edge of the source interferes with emission from the center. This may help to explain the high frequency oscillations in the spectral output recorded in FIG. 5. Other possible sources for this behavior could include impedance mismatches on the path from the device through the microphone housing to the microphone, or additional reflections with in the acoustic measurement setup. If the directivity model were included at 20 kHz frequency rather than using a spherical propagation model, η would decrease by a factor of ~23, but this would not account for the fluctuations observed at higher frequencies.

The results plotted in FIGS. 5-6 and 8 provide evidence that devices made with longer beam lengths have better performance than shorter beam lengths. This was noted earlier from incorporation of beam length effects in the model. When the conduction across the gap to the substrate is added to the model the distinction among the lengths is less distinct. In the experimental data, the 200×3 data set was obtained from a device fabricated from a different wafer than the other devices characterized, and fabrication variations (polyimide thickness, use of Al rather than Au for the metal layer) may account for its performance comparable to the 50×2 array.

As demonstrated herein, planar loudspeakers formed from nanobridge arrays using ALD and microfabrication were produced and operated in the audible range, with frequency response distinct from a magnetic voice coil loudspeaker. These transducers consisted of suspended nanobridges subject to Joule heating, and produced sound by means of the thermoacoustic effect. Both modeling and experiment indicated the efficiency of the thermoacoustic nanobridge loudspeakers increased proportional to for frequencies below 3 kHz, with some deviation from this behavior observed at f>3 kHz. At 500 Hz, 2 kHz, and 20 kHz, measured η was linearly proportional to input power, as expected from modeling.

Simultaneous operation of large numbers of devices provides resilience against failure or damage of individual nanobridges, and demonstrates a macroscale effect from large-scale parallelization of microtransducers. In the audible range, simple lumped element modeling can perform comparably to models derived from more detailed analysis, and both approaches reasonably predict experimental behavior. Lumped element modeling provides a mechanism to accommodate nonplanar thermoacoustic structures such as suspended nanobridges in exploration of spectral response. While modeling indicated some loss of η due to heat conduction to the anchored ends of the nanobridges, heat conduction to the substrate was in general the most significant mechanism for loss. In consideration of thermoacoustic loudspeaker design and measurements, far field spherical wave propagation can modify observed behavior with $f^2$ frequency dependence.

Device geometry and materials selection can play roles in optimization of the device efficiency and frequency response. Although the η of these devices in the audio range is below that of electro-magnetic transducers, the frequency spectrum is free of resonant peaks, and the devices are scalable both to large area production and to nanoscale operation. This technology provides a rich base for exploration of physical effects with increasing precision.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A nanodevice comprising:
    a solid substrate;
    a first solid supporting material block and a second solid supporting material block, wherein the first and second supporting material blocks are in physical contact with the same surface of the solid substrate, wherein the section of the solid substrate defined inbetween the first and second supporting material blocks does not comprise an additional supporting material block; and at least one ultrathin film block comprising a first face and an opposite second face, wherein:

the first face comprises a solid material nucleation layer, the opposite second face comprises an electrically conducting layer, a section of the first face of each ultrathin film block is in physical contact with the first supporting material block, a distinct section of the first face of each ultrathin film block is in physical contact with the second supporting material block, such that each ultrathin film block spans the width of the section of the solid substrate defined inbetween the first and second supporting material blocks, and the at least one ultrathin film block does not have physical contact with the solid substrate, such that the at least one ultrathin film block is suspended over the solid substrate;

wherein the at least one ultrathin film block has an average thickness that is equal to or lower than about 50 nm.

2. The nanodevice of claim 1, further comprising:

a first conductive block, which has physical and electrical contact with a section of the second face of the at least one ultrathin film blocks which is approximately opposite to the section of the corresponding first face that is in physical contact with the first supporting material block; and a second conductive block, which has physical and electrical contact with a section of the second face of the at least one ultrathin film block which is approximately opposite to the section of the corresponding first face that is in physical contact with the second supporting material block.

3. The nanodevice of claim 1, wherein the at least one ultrathin film block has an average thickness that is equal to or lower than a value selected from the group consisting of about 30 nm, about 10 nm, about 5 nm, and about 1 nm.

4. The nanodevice of claim 1, wherein the solid substrate comprises at least one selected from the group consisting of silica, alumina, glass, metal, silicon, semiconductor, electrical insulator, vitreous carbon, plastic, polymer, elastomer, fabric, paper, and nanofibrous article.

5. The nanodevice of claim 1, wherein the solid supporting material layer is deposited using at least one selected from the method consisting of molecular layer deposition (MLD), atomic layer deposition (ALD), spin-coating, spray coating, contact adhesion, casting, evaporation, and sputtering.

6. The nanodevice of claim 1, wherein the solid supporting material layer comprises at least one selected from the group consisting of a polyimide, polydimethylsiloxane, polystyrene, epoxy, polypropylene, poly(methyl (meth)acrylate), polyethylene, poly(vinyl chloride), polycaprolactone, polyethylene terephthalate, polyvinyl alcohol, polysaccharide, chitin, polypeptide, and polylysine.

7. The nanodevice of claim 1, wherein the section of the solid substrate defined inbetween the first and second supporting material blocks is essentially free from the supporting material, or has a coating of supporting material which has lower thickness than the thickness of the first or second supporting material blocks.

8. The nanodevice of claim 1, wherein the first and second supporting material blocks have approximately the same thickness.

9. The nanodevice of claim 1, wherein the at least one ultrathin film block is prepared using a manufacturing method comprising atomic layer deposition (ALD).

10. The nanodevice of claim 9, wherein the manufacturing method further comprises atomic layer etching (ALE).

11. The nanodevice of claim 9, wherein the nucleation layer and the electrically conducting layer are prepared using a method comprising ALD.

12. The nanodevice of claim 1, wherein the at least one ultrathin film block comprises at least one selected from the group consisting of a metal, metal oxide, semimetal, semiconductor, alkoxide polymer, polyamide, and metal nitride.

13. The nanodevice of claim 1, wherein the nucleation layer comprises at least one selected from the group consisting of $Al_2O_3$, $GeO_2$, $HfO_2$, indium tin oxide, $RuO_2$, SiC, SiGe, $SiO_2$, $Si_3N_4$, AlN, BN, GaN, diamond, $SnO_2$, $TaN_x$, $TaO_x$, TiC, TiN, $TiO_2$, $V_2O_5$, $VO_x$, ZnO, ZnS, and $ZrO_2$.

14. The nanodevice of claim 1, wherein the electrically conducting layer comprises at least one selected from the group consisting of Ag, Al, Au, Co, Cu, Fe, Ge, Ir, Mo, Ni, Os, Pd, Pt, Rh, Ru, Si, Ta, Ti, and W.

15. The nanodevice of claim 2, wherein the first and second conductive blocks are independently selected from the group consisting of Al, Ti, Cu, Ni, Ta, Cr, Ag, Mo, and Au.

16. The nanodevice of claim 1, which is at least partially immersed in a fluid.

17. The nanodevice of claim 16, wherein, when a stimulus is applied to the first and conductive blocks, the at least one ultrathin film block undergoes temperature changes, wherein the stimulus comprises at least one selected from the group consisting of electrical current, electromagnetic radiation, energetic particle, and subatomic particle.

18. The nanodevice of claim 17, wherein the temperature changes of the at least one ultrathin film block form pressure waves or thermal waves in the surrounding fluid.

19. The nanodevice of claim 1, which is a thermal or thermoacoustic nanodevice.

20. A method of preparing the nanodevice of claim 1, comprising:

(a) depositing a layer of solid supporting material on at least a section of the solid substrate;

(b) depositing a nucleation layer on at least a section of the surface of the solid supporting material using ALD;

(c) depositing an electrically conducting layer on the deposited nucleation layer using ALD;

(d) patterning the width and length of the at least one ultrathin film block on the surface of the ALD-deposited nucleation and electrically conducting layers using etching; and (e) removing the exposed solid supporting material through etching, so as to allow the resulting at least one ultrathin film block to be suspended over the solid substrate.

21. The method of claim 20, wherein, after the width and length of the at least one ultrathin film block is patterned, the first and second conductive blocks are further deposited and patterned, such that the first conductive block physically and electrically contacts one exposed length-wise extremity of the surface of the at least one patterned ALD-deposited layer, and the second conductive block physically and electrically contacts the opposing exposed length-wise extremity of the surface of the at least one patterned ALD-deposited layer.

22. A method of generating at least one wave selected from the group consisting of thermal, pressure, and sound, in a fluid using the nanodevice of claim 1, the method comprising applying a stimulus to the at least one ultrathin film block of the nanodevice of claim 1, wherein the nanodevice is at least partially immersed in the fluid,
wherein the stimulus is at least one selected from the group consisting of electrical
current, electromagnetic radiation, energetic particle, and subatomic particle, whereby the at least one ultrathin film block undergoes temperature changes, which promotes formation in the surrounding fluid of at least one wave selected from the group consisting of thermal wave, pressure wave, and sound wave.

\* \* \* \* \*